(12) United States Patent
Kamgaing et al.

(10) Patent No.: US 11,283,427 B2
(45) Date of Patent: Mar. 22, 2022

(54) HYBRID FILTERS AND PACKAGES THEREFOR

(71) Applicant: Intel Corporation, Santa Clara, CA (US)

(72) Inventors: Telesphor Kamgaing, Chandler, AZ (US); Feras Eid, Chandler, AZ (US); Georgios C. Dogiamis, Chandler, AZ (US); Vijay K. Nair, Mesa, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 65 days.

(21) Appl. No.: 16/648,639

(22) PCT Filed: Dec. 28, 2017

(86) PCT No.: PCT/US2017/068795
§ 371 (c)(1),
(2) Date: Mar. 18, 2020

(87) PCT Pub. No.: WO2019/132937
PCT Pub. Date: Jul. 4, 2019

(65) Prior Publication Data
US 2020/0287520 A1    Sep. 10, 2020

(51) Int. Cl.
*H03H 9/54*    (2006.01)
*H03H 9/56*    (2006.01)
(Continued)

(52) U.S. Cl.
CPC .......... *H03H 9/542* (2013.01); *H03H 9/0542* (2013.01); *H03H 9/131* (2013.01); *H03H 9/566* (2013.01)

(58) Field of Classification Search
CPC ...... H03H 9/542; H03H 9/0542; H03H 9/131; H03H 9/566; H03H 2001/0085;
(Continued)

(56) References Cited

U.S. PATENT DOCUMENTS 3,613,032 A * 10/1971 Pond ...................... H03H 9/542
333/189
2005/0012565 A1 * 1/2005 Kamata ................ H03H 7/1775
333/174

(Continued)

OTHER PUBLICATIONS

International Preliminary Report on Patentability for International Patent Application No. PCT/US2017/068795, dated Jul. 9, 2020, 9 pgs.
(Continued)

*Primary Examiner* — Rakesh B Patel
*Assistant Examiner* — Jorge L Salazar, Jr.
(74) *Attorney, Agent, or Firm* — Schwabe, Williamson & Wyatt, P.C.

(57) ABSTRACT

Hybrid filters and more particularly filters having acoustic wave resonators (AWRs) and lumped component (LC) resonators and packages therefor are described. In an example, a packaged filter includes a package substrate, the package substrate having a first side and a second side, the second side opposite the first side. A first acoustic wave resonator (AWR) device is coupled to the package substrate, the first AWR device comprising a resonator. A plurality of inductors is in the package substrate.

24 Claims, 10 Drawing Sheets

(51) Int. Cl.
*H03H 9/05* (2006.01)
*H03H 9/13* (2006.01)

(58) Field of Classification Search
CPC .. H03H 9/0561; H03H 9/1071; H03H 7/1775; H03H 7/09; H03H 9/0552; H03H 9/0557; H03H 9/1014; H03H 7/1766
USPC .......... 333/133, 187, 188, 193–196
See application file for complete search history.

(56) References Cited

U.S. PATENT DOCUMENTS

| | | |
|---|---|---|
| 2006/0284703 A1* | 12/2006 | Iwasaki ............... H03H 9/0004 333/133 |
| 2013/0328642 A1 | 12/2013 | Ma et al. |
| 2014/0035702 A1 | 2/2014 | Black et al. |
| 2017/0093369 A1 | 3/2017 | Khlat et al. |
| 2017/0133999 A1 | 5/2017 | Ishizuka et al. |
| 2017/0257078 A1 | 9/2017 | Leipold et al. |

OTHER PUBLICATIONS

International Search Report and Written Opinion for International Patent Application No. PCT/US2017/068795, dated Sep. 17, 2018, 12 pgs.

* cited by examiner

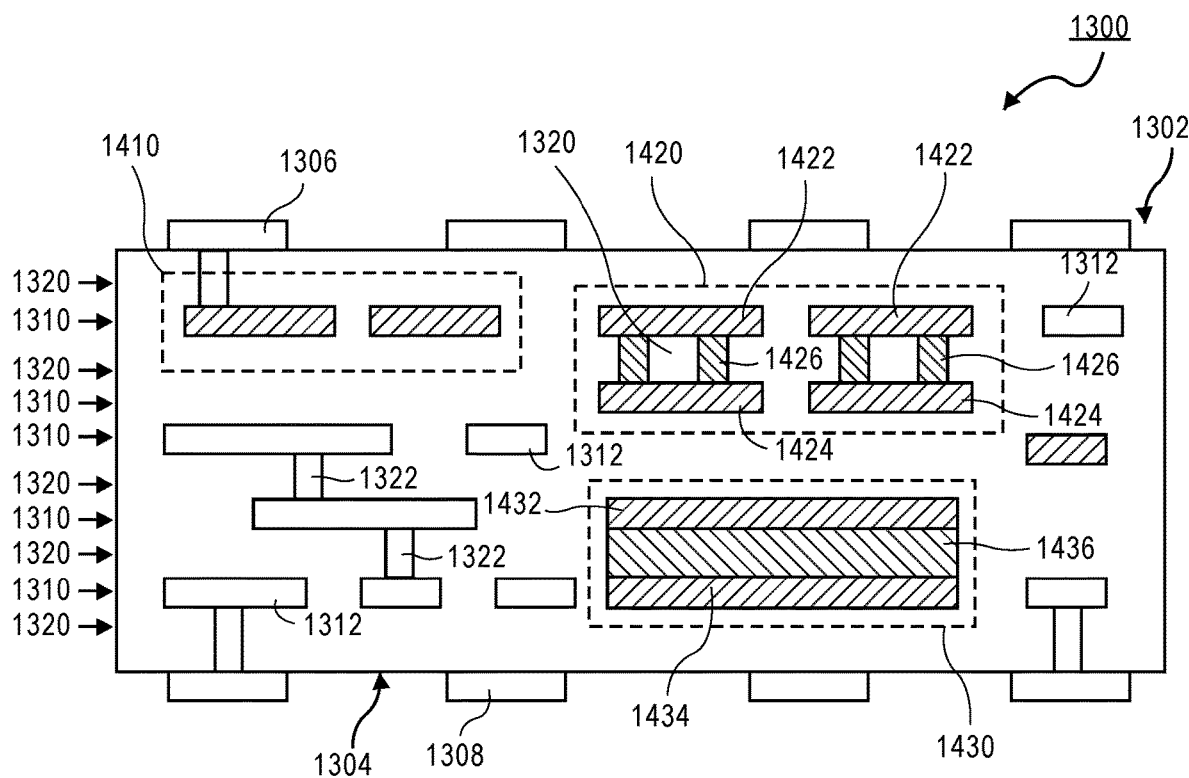
FIG. 14A
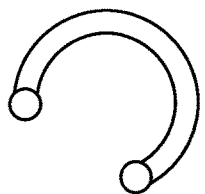 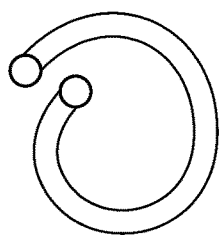 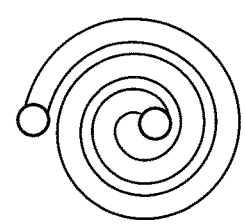
FIG. 14B   FIG. 14C   FIG. 14D
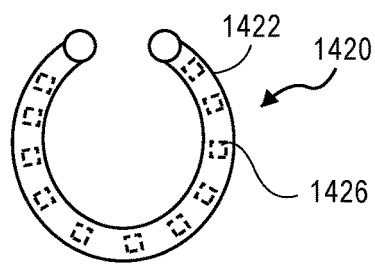 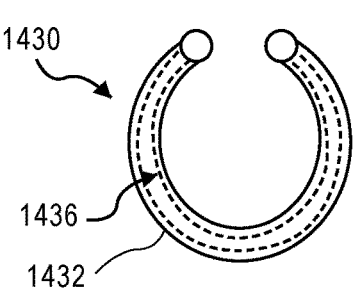
FIG. 14E   FIG. 14F

HYBRID FILTERS AND PACKAGES THEREFOR

CROSS-REFERENCE TO RELATED APPLICATION

This patent application is a U.S. National Phase Application under 35 U.S.C. § 371 of International Application No. PCT/US2017/068795, filed Dec. 28, 2017, entitled "HYBRID FILTERS AND PACKAGES THEREFOR," which designates the United States of America, the entire disclosure of which is hereby incorporated by reference in its entirety and for all purposes.

TECHNICAL FIELD

Embodiments of the present disclosure relate to hybrid filters and more particularly to filters having acoustic wave resonators (AWRs), lumped component (LC) resonators and transformers and packages therefor.

BACKGROUND

Filters operating at microwave frequencies are important for today's and next generation mobile and wireless communication devices and infrastructure. In 5G networks for example, the amount of data to be generated and exchanged between user terminals and networks will increase substantially in comparison to 3G and 4G. The implementation of wireless access points for machine to machine communication will add to the already high number of filters that are being used in the radio front end module today. These new multi-radio platforms will require the use of highly selective filters with low passband insertion loss to guarantee the required signal integrity. In addition, the filters need broad frequency bandwidth to enable wireless high speed data transfer. In fact each user's terminal device should be able to process data at speeds averaging about 1 Gigabit per second with network latency below 10 ms. Broadband Radio Frequency (RF) filters will be required to achieve the desired data rate without an increase in the network latency because they can enable architectures with relatively low order modulation schemes.

In previous generation mobile and wireless communication standards, cellular RF front end filters have traditionally used acoustic wave resonators arranged in lattice, ladder format or combinations of both. The properties of those acoustic wave materials and associated resonators have been a limiting factor for achieving broadband filtering.

Acoustic wave filters and resonators, however, remain attractive because they exhibit sharp roll-offs at the passband edge and therefore enable the coexistence of filters with frequency channels that are close to each other. For example, acoustic wave filters can be implemented with a guard band (e.g., signal rejection range between 2 transmission bands) of only a few 10s MHz between them. Lumped element filters have been widely used in WiFi for personal computers, smartphones, tablets and desktops. They usually exhibit very broad passband frequency range for example between 100 MHz around 2.4 GHz and almost 1 GHz (4.9-5.8 GHz) at the WiFi upper band. Unfortunately lumped element filters have very slow roll-off leading to filters with poor selectivity around the passband edge. This means an efficient utilization of the frequency spectrum is not possible when lumped component filters are used in a multi-radio platform.

BRIEF DESCRIPTION OF THE DRAWINGS

FIGS. 14A-14F illustrate various inductors which may be embedded into a package substrate in accordance with embodiments of the present disclosure.

EMBODIMENTS OF THE PRESENT DISCLOSURE

Figure 1:
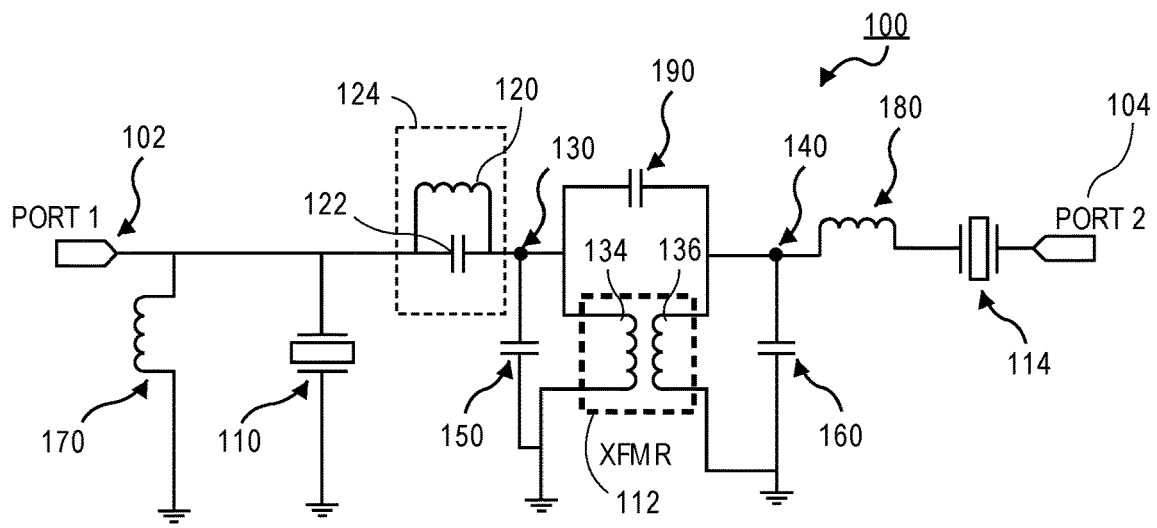
FIG. 1 is a schematic illustration of an RF hybrid circuit or filter in accordance with an embodiment of the present disclosure.

Hybrid filters and more particularly filters having acoustic wave resonators (AWRs), lumped component resonators and transformers and packages therefor are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments of the present disclosure relate to hybrid filters and more particularly to filters having acoustic wave resonators (AWRs), lumped component resonators, and transformers and packages therefor. Embodiments of the present disclosure relate to a radio frequency (RF) hybrid filter having a plurality of acoustic wave resonators (AWR) and a transformer based resonator. The basic principle of the embodiments of the present disclosure consist of utilizing at least one RF transformer as the core of an LC resonator and one or more acoustic wave resonators to improve the out of band rejection of the resulting hybrid filter. The use of a transformer reduces the number of components in the filter. Additionally, the broadband nature of a transformer results in low parasitics and therefore enables filters operating at high frequencies. The filter can be further implemented by using an equivalent circuit of a transformer, such as a T-network or a Pi-network. In an embodiment, the hybrid circuit includes multiple parallel acoustic wave resonators to enhance the signal rejection in the guard band and at the band edge. The hybrid filter of the present disclosure may exhibit wide bandwidth and sharp roll off. The hybrid filter of the present disclosure may be used in next generation mobile and wireless communication devices and infrastructures which require the handling of data at high rates, such as 5G networks. In embodiments, the filters of the present disclosure may exhibit excellent roll off and out of band rejection to enable multi-radio coexistence.

Embodiments of the present disclosure are further directed to packages containing a hybrid filter. In an embodiment, a package includes one or more acoustic wave resonator (AWR) devices attached to a package substrate, such as a multilayer organic substrate or a low temperature co-fired ceramic substrate. The AWR devices may contain one or more acoustic wave resonators hermetically sealed therein. The package substrate may contain one or more passive devices, such as but not limited to capacitors, inductors, and transformers embedded therein. In this way, a hybrid filter in accordance with embodiments of the present disclosure may be contained in a single package and thereby have a reduced form factor and improved performance.

In embodiments of the present disclosure the hybrid filter is a hybrid LC/AWR (lumped component/acoustic wave resonator) filter comprising RF passive elements, such as inductors, transformers and capacitors, and acoustic wave resonators fabricated using a piezoelectric material, such as a thin film bulk acoustic resonator (FBAR to TFBAR). In an embodiment, a first winding of a transformer may be coupled to a first port and to a first acoustic wave resonator and a second acoustic wave resonator may be coupled to a second winding of the transformer and to a second port. A first capacitor may be coupled in parallel with the first winding of the inductor and a second capacitor may be coupled in parallel with a second winding of the transformer. A lumped element resonator comprising an inductor coupled in parallel with a capacitor may be disposed between the coupling of the first acoustic wave resonator and the first winding of the transformer.

FIG. 1 is a schematic illustration of an RF hybrid circuit or filter 100 in accordance with an embodiment of the present disclosure. Hybrid filter 100 includes a first acoustic wave resonator (AWR) 110, a lumped component resonator 124, a transformer (XFMR) 112 and a second acoustic wave resonator (AWR) 114. In an embodiment, first AWR 110 has a first electrode coupled to a first port or an input port 102 and has a second electrode coupled to ground. In an embodiment, an inductor 120 has a first terminal coupled to the first electrode of AWR 110 and to the input port 102 and a second terminal coupled to a first node 130. A capacitor 122 is coupled in parallel with inductor 120. The capacitor 122 and the inductor 120 create a lump element resonator 124 which forms a transmission zero either below or above the pass band region. A first coil or winding 134 of transformer 112 has a first terminal coupled to node 130 and a second terminal couple to ground. A second coil or winding 136 of transformer 112 has a first terminal coupled to a node 140 and a second terminal coupled to ground as illustrated in FIG. 1. A capacitor 150 has a first electrode or plate coupled to node 130 and in an embodiment a second electrode or plate coupled to ground. In an embodiment the second electrode of capacitor 150 is directly connected to the second terminal of first winding 134 of transformer 112. A capacitor 160 has a first electrode or plate coupled to node 140 and in an embodiment has a second electrode or plate coupled to ground. In an embodiment, the second electrode of capacitor 160 is directly connected to the second terminal of the second winding 136 of transformer 112. Although each of the second terminals of capacitor 150 and capacitor 160 are illustrated as being coupled to ground, they may each be, in an embodiment, connected to a same or different DC voltage in order to provide tuning capabilities. The poles of the filter are defined by capacitors 150 and 160 and transformer 112. In an embodiment, filter 100 has two poles and therefore may be considered a second order filter. In another embodiment filter 100 has more than two poles and be considered a higher order filter.

Second AWR 114 has a first electrode coupled to node 140 and a second electrode coupled to a second port or output port 104. In an embodiment, hybrid filter 100 of FIG. 1 includes two acoustic wave resonators, AWR 110 and AWR 114. The acoustic wave resonators act as a transmission zero around the edge of the passband and therefore enable filter 100 to achieve strong rejection in the adjacent guard band.

In an embodiment, filter 100 may include one or more matching inductors. In an embodiment, filter 100 includes an inductor 170 having a first terminal coupled to input port 102 and a second terminal coupled to ground. In an embodiment, filter 100 may include an inductor 180 disposed between second AWR 114 and node 140. In an embodiment, inductor 180 has a first terminal coupled to node 140 and a second terminal to the first electrode of AWR 114, as illustrated in FIG. 1. In an embodiment, inductor 170 and inductor 180 are matching inductors and act as transmission zeroes (responsible for signal attenuation) at low and high frequencies, respectively.

In an embodiment, filter 100 may include a capacitor 190 having a first electrode or plate coupled to node 130 and a second electrode or plate coupled to node 140, as illustrated in FIG. 1. Capacitor 190 may form another transmission zero with transformer 112.

In embodiments of the present disclosure, individual ones of the inductors 120, 170, and 180 may be implemented as a series combination of two or more smaller inductors to improve the frequency range of operation, the in-band and out of band performance at a cost of inductance density and/or quality factor. Similarly, individual ones of the capacitors 122, 150, 160 and 190 may be implemented as a parallel combination of two or more smaller capacitors. In an embodiment, the inductors may have an inductance in the range of 0.1 to 15 nanoHenry (nH). In an embodiment, the capacitors may have a capacitance in the range of 0.1 to 15 picofarads (pF).

First winding 134 and second winding 136 of transformer 112 may be inductively coupled together. That is, first winding 134 and second winding 136 may be sufficiently close together to provide mutual inductive coupling. In an embodiment, first winding 134 and second winding 136 have a low inductive mutual coupling coefficient of between 0.01 to 0.5. In an embodiment, first winding 134 and second winding 136 are sufficiently sized to create an inductance ratio between 1:2-2:1. In an embodiment first winding 134 and second winding 136 have an inductance ratio of approximately 1:1. First winding 134 may be considered the primary coil of transformer 112 and second winding 136 may be considered the secondary winding of transformer 112.

In an embodiment, hybrid filter 100 is an RF bandpass filter. Filter 100 may reject signals at both low and high frequencies. The signal transmission between input port 102 and output port 104 is maximum in the desired passband region. In an embodiment, an RF analog input signal having a frequency between 800 MHz to 8 GHz is applied to input port 102. In an embodiment, an analog signal between 3.3 to 4.2 GHz is provided to input port 102. In yet another embodiment, an input signal between 4.4 to 4.9 GHz is provided to input port 102. The input signal passes through filter 100 and a filtered analog output signal is provided on output port 104.

Figure 2:
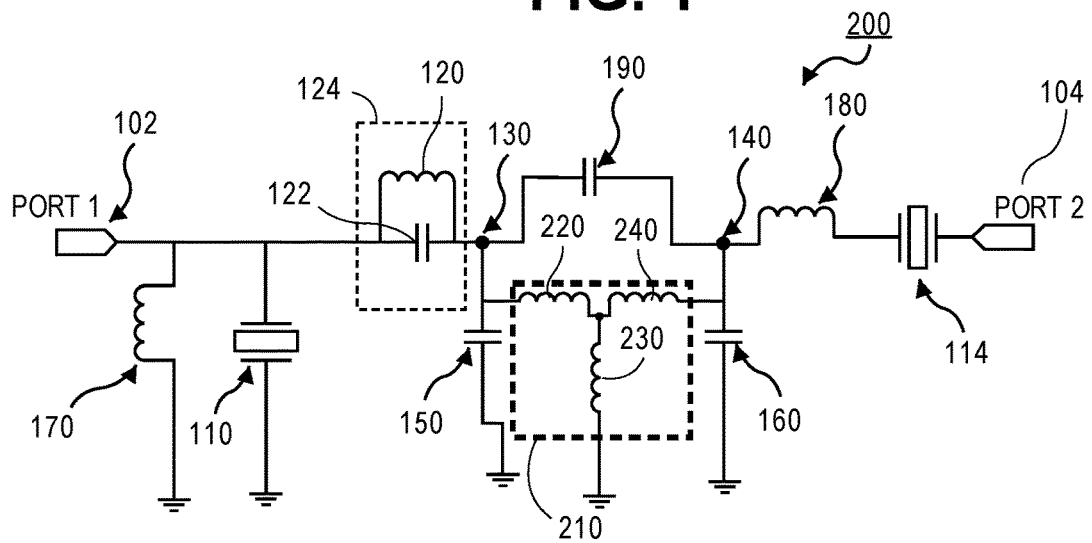
FIG. 2 illustrates a hybrid filter in accordance with an embodiment of the present disclosure.

FIG. 2 illustrates a hybrid filter 200 in accordance with an embodiment of the present disclosure. Hybrid filter 200 is similar to hybrid filter 100 except that transformer 112 is replaced with a transformer equivalent circuit 210. In an embodiment, the transformer equivalent circuit 210 is a T-network of inductors. In an embodiment, hybrid filter 200 includes an inductor 220 having a first terminal coupled to node 130 and a second terminal coupled to a first terminal of an inductor 230. A second terminal of inductor 230 may be coupled to ground. An inductor 240 has a first terminal coupled to node 140 and a second terminal coupled to the second terminal of inductor 220 and to the first terminal of inductor 230 as schematically illustrated in FIG. 2. The T-network created by inductors 220, 230, and 240 may be useful when the mutual coupling coefficient of transformer 112 is sensitive to process variations.

Figure 3:
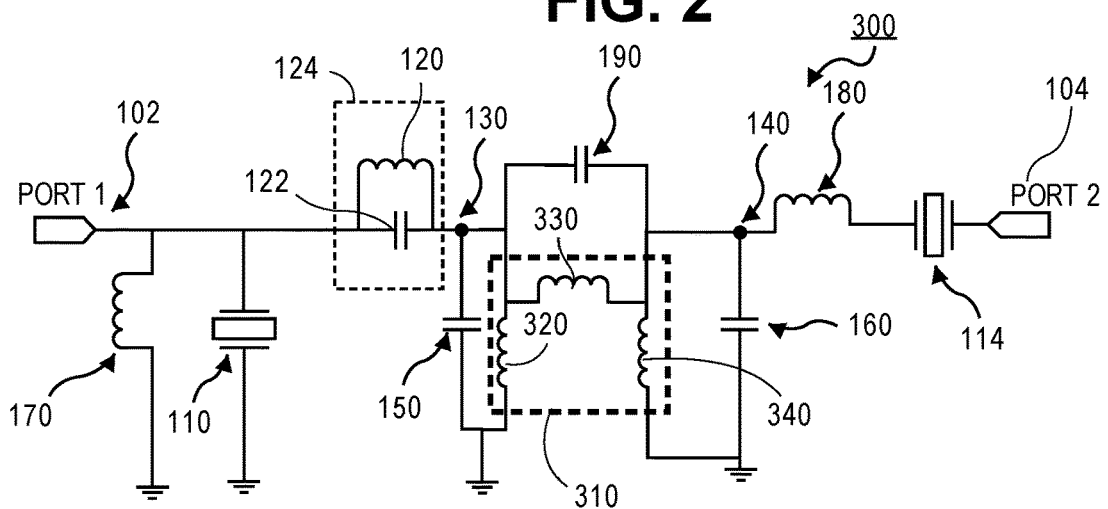
FIG. 3 illustrates a hybrid filter in accordance with an embodiment of the present disclosure.

FIG. 3 illustrates a hybrid filter 300 in accordance with an embodiment of the present disclosure. Hybrid filter 300 is similar to hybrid filter 100 except that transformer 112 is replaced with a Pi-network of transformers 310. In an embodiment, hybrid filter 300 includes an inductor 320 having a first terminal coupled to node 130 and a second terminal coupled to ground. An inductor 330 has a first terminal coupled to node 130 and a second terminal coupled to node 140. A transformer 340 has a first terminal coupled to node 140 and a second terminal coupled to ground. The Pi-network of inductors created by inductors 320, 330 and 340 may be useful when the mutual coupling coefficient of transformer 112 is sensitive to process variations.

Figure 4:
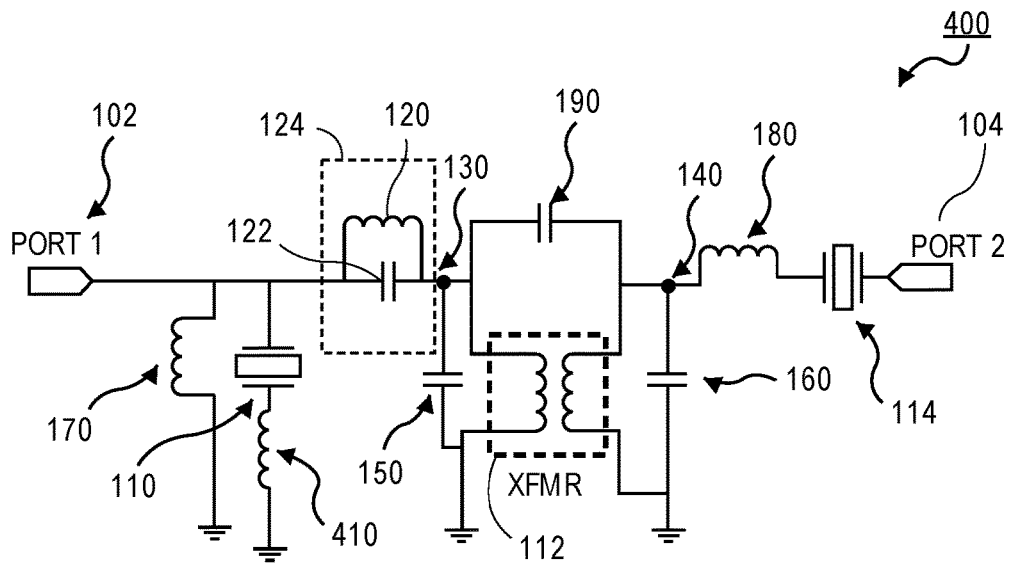
FIG. 4 is a schematic illustration of a hybrid filter in accordance with embodiments of the present disclosure.

FIG. 4 is a schematic illustration of a hybrid filter 400 in accordance with embodiments of the present disclosure. Hybrid filter 400 is similar to hybrid filter 100 but includes an inductor 410 located between AWR 110 and ground. That is, in an embodiment, inductor 410 has a first terminal coupled to the second electrode of AWR 110 and has a second terminal coupled to ground. Adding inductor 410 in series with AWR 110 generates another resonance for transmission zero to improve out of band rejection of hybrid filter 400. Inductor 410 may be considered a matching inductor which helps attenuate the out of band signal of filter 400.

Figure 5:
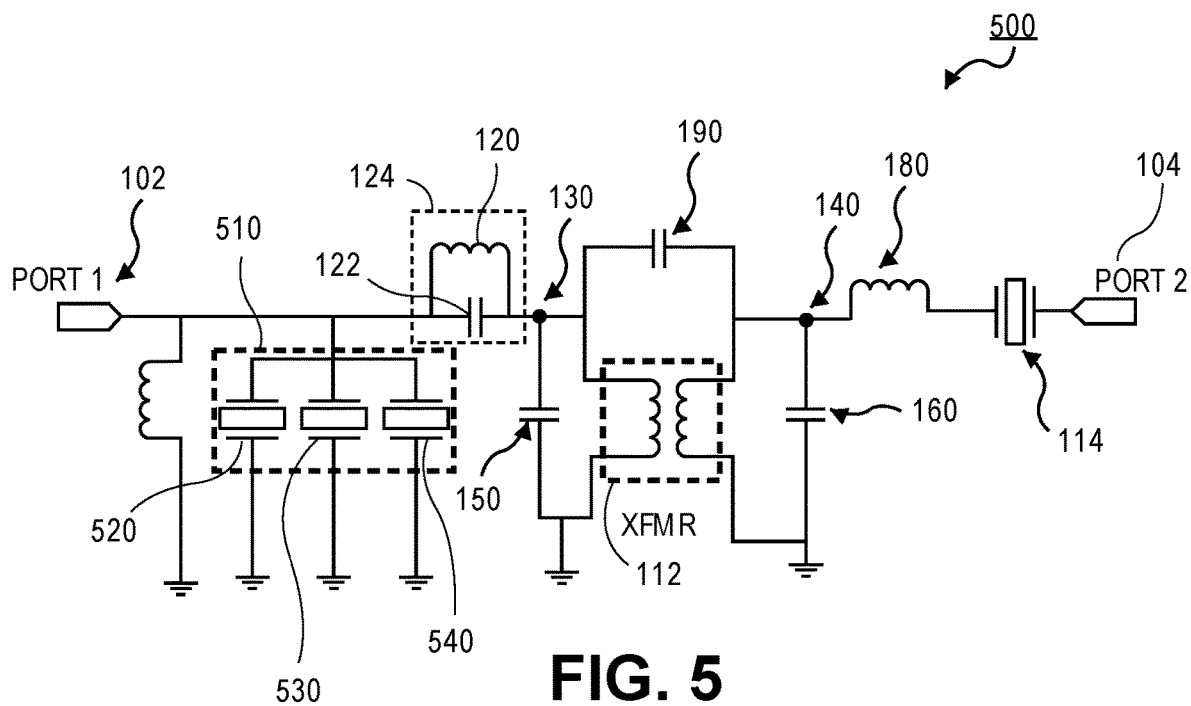
FIG. 5 is a schematic illustration of a hybrid filter according to an embodiment of the present disclosure.

FIG. 5 is a schematic illustration of a hybrid filter 500 according to an embodiment of the present disclosure. Hybrid filter 500 is similar to hybrid filter 100 but includes a bank of acoustic wave resonators 510 in place of acoustic wave resonator 110. In an embodiment, hybrid circuit 500 includes a plurality of acoustic wave resonators, such as acoustic wave resonators 520, 530 and 540, coupled in parallel. In an embodiment, each of the resonators, (e.g., 520, 530, and 540) has a first electrode coupled to input port 102 and a second electrode coupled to ground. In an embodiment, the second electrodes may be coupled to ground through an inductor, such as an inductor 410 of hybrid filter 400 as shown in FIG. 4. In an embodiment, each of the inductors of the bank of inductors 510 has a slightly offset resonance frequency. For example, AWR 520 may have a first resonance frequency, and AWR 530 may have a second resonance frequency different (e.g., higher) than the first resonance frequency, an AWR 540 may have a third resonance frequency which is different (e.g., higher) than both the first and second resonance frequencies. In an embodiment, each of the AWRs of the bank of AWR 510 has a resonance frequency bandwidth wherein each of the resonance frequency bandwidth are slightly offset and overlapping. For example, AWR 520 may have a resonance frequency bandwidth of 4.905 to 4.920 GHz while AWR 530 has as resonance frequency bandwidth of 4.915 to 4.930 GHz and AWR 540 may have a bandwidth between 4.925 to 4.940 GHz. In an embodiment, each of the resonators of the bank of resonators 510 has a slightly offset resonance frequency or resonance bandwidth to help generate a roll off at the edge of the band. In other words, having multiple resonators with offset resonance frequencies helps counteract the signal pull back from the LC network.

Although, hybrid filter 500 is illustrated with a bank of AWRs 510 having three AWRs 520, 530 and 540 it is to be appreciated that the bank 510 may have more or less AWRs. In an embodiment, hybrid circuit 500 has between 2-10 AWRs in bank 510. In an embodiment, each of the resonators inside the resonator bank may also have individual series inductance to the ground.

Additionally, in an embodiment, a similar approach may be used for AWR 114 of hybrid filter 100. For example, in an embodiment, AWR 114 may be replaced by a bank of parallelly coupled acoustic wave resonators having offset resonance frequencies. In another embodiment, AWR 114 may be replaced by a plurality of serially coupled AWRs having different resonance frequencies.

Referring again to the filters of FIGS. 1-5, in an embodiment, each of the electrical couplings of the various passive components (e.g., inductors, capacitors, transformers and acoustic wave resonators) are by direct electrical connection without intervening elements there between, as illustrated in FIGS. 1-5.

Figure 6A:
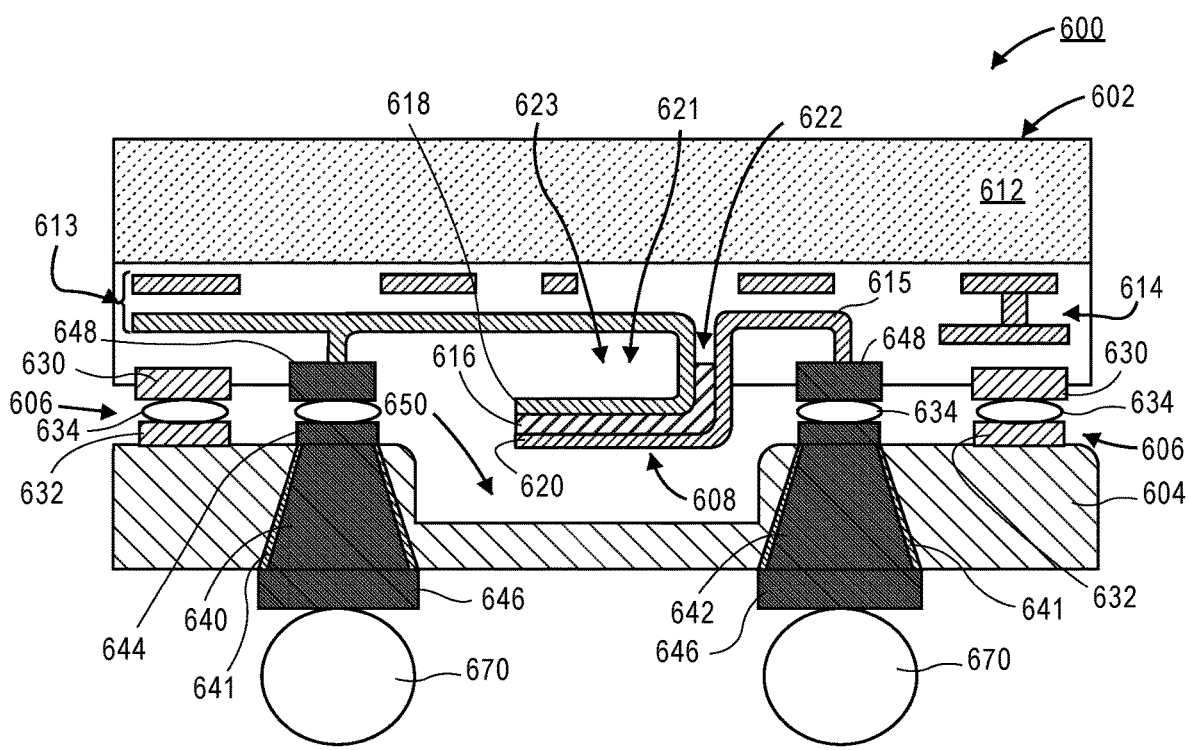
FIGS. 6A and 6B illustrate a cross-sectional view and corresponding plan view of an acoustic wave resonator device in accordance with an embodiment of the present disclosure.
Figure 6B:
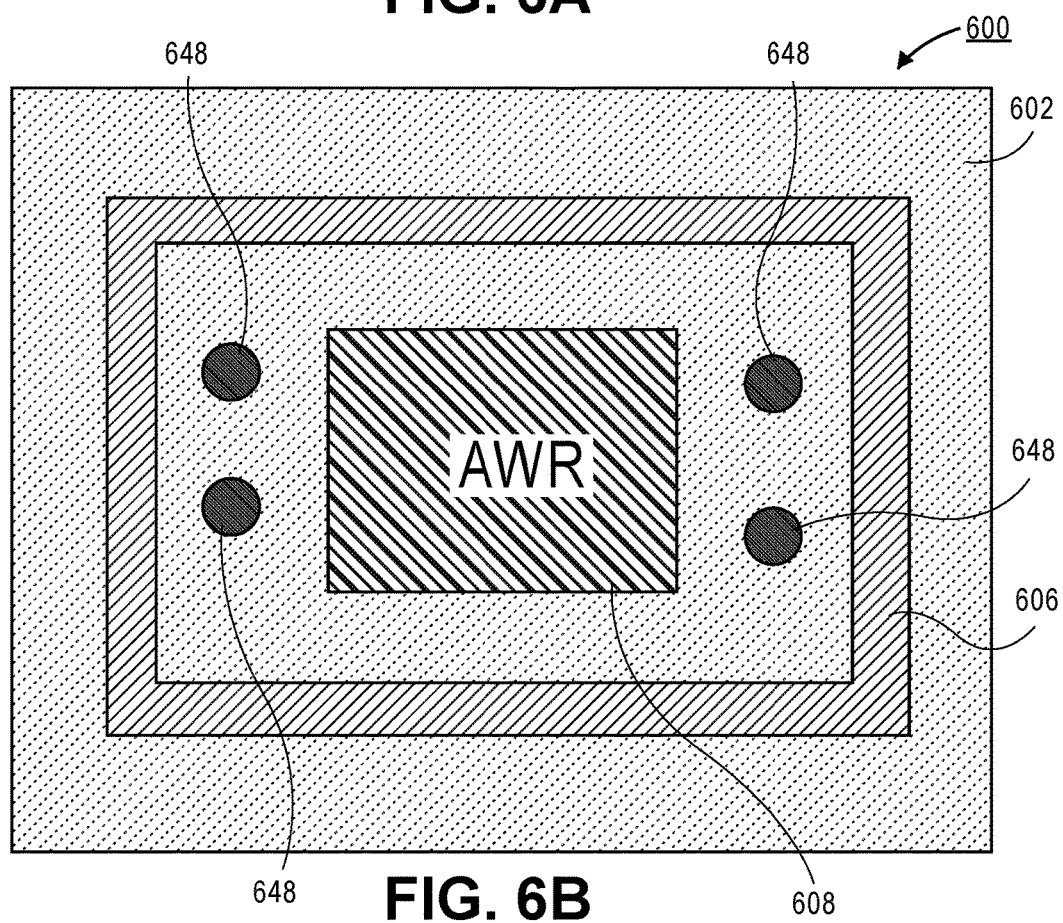

FIGS. 6A and 6B illustrate an acoustic wave resonator device 600 in accordance with an embodiment of the present disclosure. In an embodiment, AWR device 600 includes an acoustic wave resonator (AWR) die 602 and an acoustic wave resonator (AWR) cap 604. The AWR cap 604 is attached to the AWR die 602 by a seal ring or frame 606. AWR die 602 includes an acoustic wave resonator (or resonator) 608. In an embodiment, the AWR die includes a substrate 612 and an interconnect structure 614 disposed on the substrate 612. Substrate 612 may be any suitable substrate, such as but not limited to a semiconductor substrate, such as a silicon substrate, a glass substrate, or a ceramic substrate. Interconnect structure 614 may include multiple levels of metallization separated by dielectric layers and interconnected by conductive vias to enable electrical signal coupling between the AWR die 602 and other components, such as other components of a hybrid filter. In an embodiment, resonator 608 may be formed in interconnect structure 614 of AWR die 602 as illustrated in FIG. 6A. In an embodiment, one or more capacitors 613 may be embedded in interconnect structure 614. The capacitors 613 may take the form of parallel plate capacitors, interdigitated capacitors, MIM capacitors, and cup capacitors. In an embodiment, an electrode of resonator 608 is coupled to capacitor 613. Although a single resonator 608 is illustrated in FIGS. 6A and 6B, it is to be appreciated that multiple resonators 608 may be fabricated in a single AWR die 602. Such multiple resonators may have a same or different resonance frequency.

Resonator 608 may be any well known acoustic wave resonator such as, but not limited to, a bulk acoustic wave resonator (BAW), a thin film bulk acoustic wave resonator (FBAR), a solidly mounted resonator (SMR), a contour-mode resonator (CMR), a composite longitudinal mode resonator (CLMR) or a surface acoustic wave (SAW) device. In an embodiment of the present disclosure resonator 608 is a thin film bulk acoustic resonator having a piezoelectric material 616 sandwiched between a first electrode 618 and a second electrode 620. The piezoelectric material 616 may be any suitable piezoelectric material, such as but not limited to aluminum nitride, zinc oxide, lead zirconate titanate (PZT), sodium potassium niobate (KNN), and the like. In an embodiment, the piezoelectric material may have a thickness ranging from several micrometers down to few hundredths of a micrometer. In an embodiment, the acoustic wave resonator has a resonance frequency or may resonate at a frequency between 10 MHz to 10 GHz. In an embodiment, the resonator 608 includes a cantilever portion 621 and an anchored portion 622. In an embodiment, the cantilever portion 621 extends under a cavity 623 disposed in interconnect structure 614 in order to enable the cantilever portion 621 to translate between 0.1-3 microns.

In an embodiment, cap 604 is attached to AWR die 602 by seal ring or frame 606. Seal ring or frame 606 completely surrounds resonator 608 and creates a hermetic seal between AWR die 602 and cap 604 as illustrated in FIG. 6B. Seal ring or frame 606 creates a hermetic and acoustically sealed air cavity around resonator 608 which protects resonator 608 from environmental conditions and interference. Seal ring or frame 606 may be made from a metal, such as but not limited to gold, copper, tin and indium. In other embodiments, seal ring or frame 606 may be made of a material, such as but not limited to a glass frit, a ceramic, a polymer, a liquid crystal polymer, and an inorganic dielectric. In an embodiment, seal ring or frame 606 may have a thickness between 0.5-10 microns. In an embodiment, seal ring or frame 606 includes a metal ring or frame 630 disposed on the outer surface of AWR die 602 and a metal ring or frame 632 on a die side of cap 604. Metal ring 630 and metal ring 632 may then be directly bonded together by, for example, diffusion bonding or may be bonded together by an intermediate solder layer 634, such as a eutectic solder.

In an embodiment, cap 604 includes a plurality of through substrate vias (TSVs) 640 and 642 to enable electrical connection through cap 604 to electrode 618 and electrode 620 of resonator 608, respectively. In an embodiment, through substrate vias 640 and 642 extend through cap 604 and electrically couple a die side bond pad 644 and an external bond pad 646. Each of the die side bond pad 644 may be electrically coupled by, for example, diffusion bonding or solder bonding to a corresponding die bond pad 648 as illustrated in FIG. 6A. Die bond pads 648 may be electrically connected to electrodes 618 and 620, as illustrated in FIG. 6A. Solder balls, bumps or other types of electrical connections may be formed on contact pad 646 to enable electrical connections of AWR device 600 to other components, such as a package substrate.

Cap 604 may be formed from a semiconductor, such as high resistivity silicon or low resistivity silicon, a ceramic, or a glass. If cap 604 is formed from a low resistivity silicon, it may be necessary to surround TSVs 640 and 642 with an insulator 641 prior to filling with a conductive layer in order to adequately isolate the TSVs from one another. In an embodiment, TSVs 640 and 642 and electrical contacts to resonator 608 are located within the perimeter of seal ring or frame 606 as illustrated in FIG. 6B. In this way, electrical connections are not formed beneath seal ring or frame 606 and the hermetic integrity of the cavity may be maintained. In an embodiment, cap 604 may contain a cavity 650 beneath resonator 608 to allow adequate movement or translation of resonator 608.

In an embodiment, AWR device 600 may be fabricated in a wafer level process. For example, in an embodiment, a plurality of AWR dies 602 each including a resonator 608 may be fabricated on a wafer in a XY array. Similarly, a plurality of caps 604 may be fabricated across another wafer in a similar XY array. The two wafers may then be bonded together at, for example, the contacts and seal rings or frames. After bonding to create a plurality of AWR devices in wafer form, the combined wafers may be singulated to create individual AWR devices 600. Such a process may yield an AWR die 602 where the outer diameter of the cap 604 directly matches the outer diameter of the AWR die 602, as illustrated in FIG. 6A. In an embodiment, AWR device 600 has a thickness between 50 microns to 300 microns. In an embodiment, resonator 608 may have an x-y size between 50 micron by 50 microns to 500 microns by 500 microns.

Figure 7A:
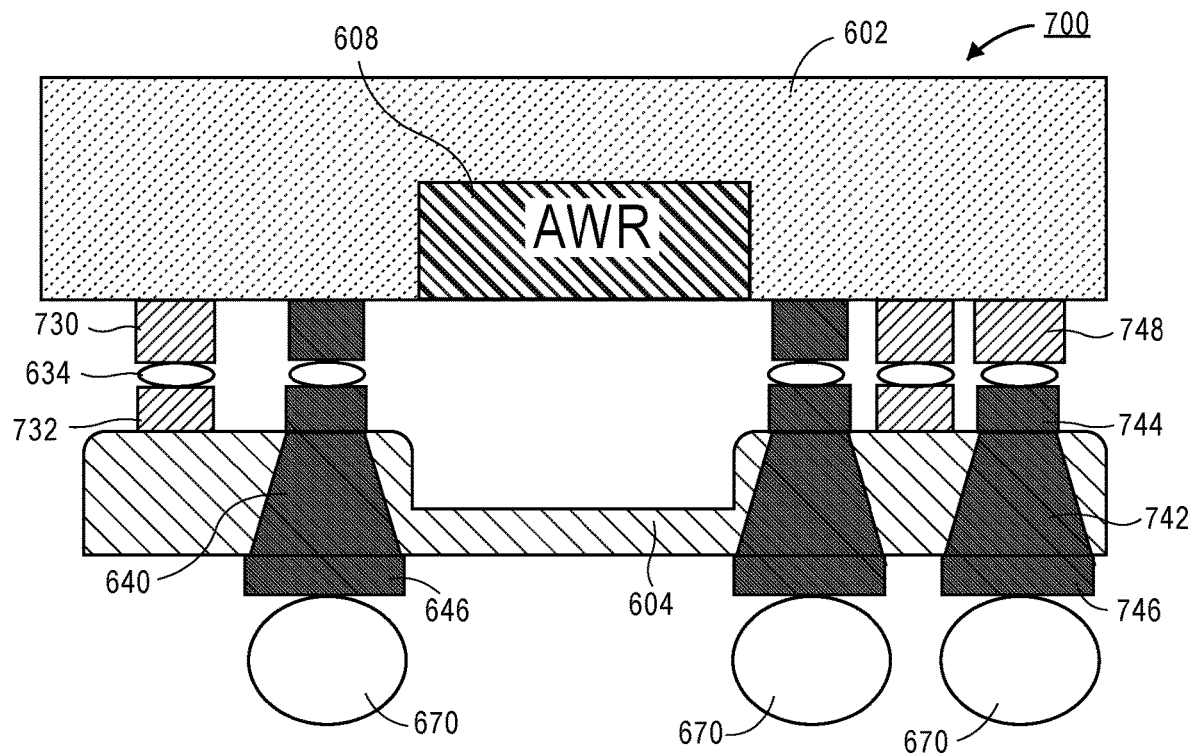
FIGS. 7A and 7B illustrate a cross-sectional view and corresponding plan view of an acoustic wave resonator (AWR) device in accordance with an embodiment of the present disclosure.
Figure 7B:
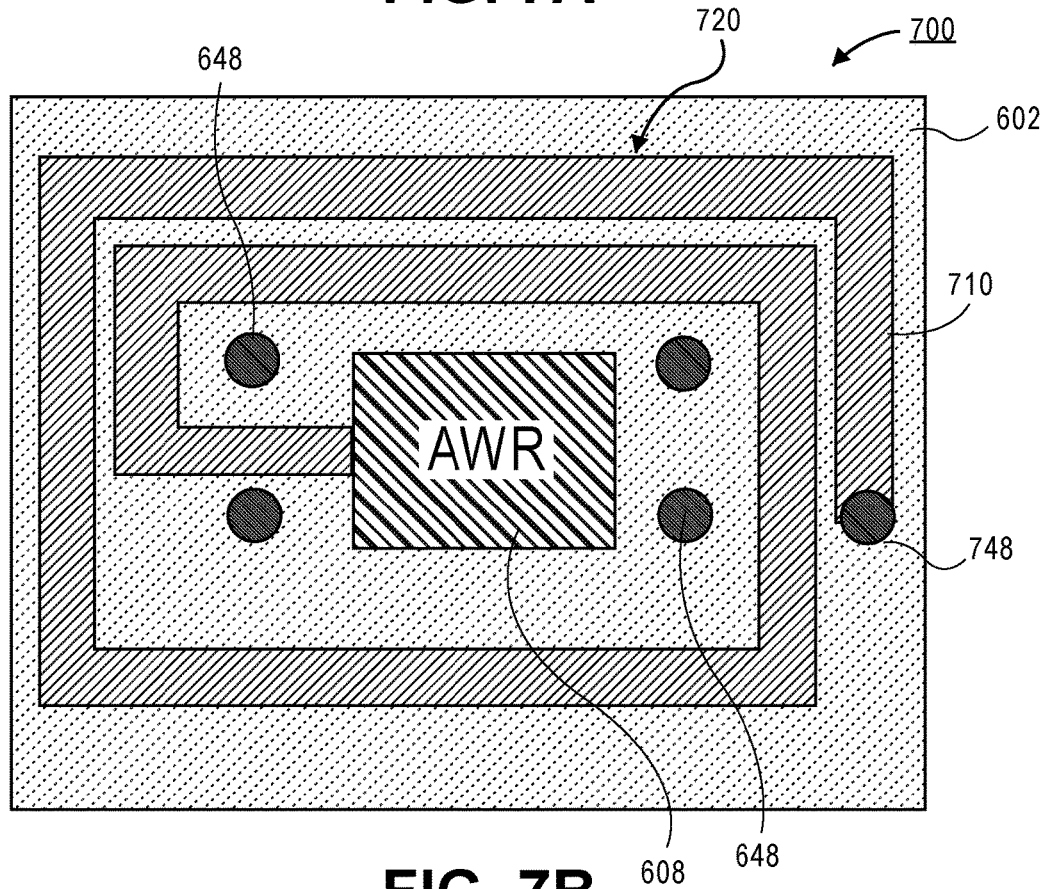

FIGS. 7A and 7B illustrate an acoustic wave resonator (AWR) device 700 in accordance with an embodiment of the present disclosure. AWR device 700 is similar to AWR device 600 except that AWR 700 includes a seal frame 710 which may also act as an inductor 720.

Seal frame 710 may include one or more loops which surrounds resonator 608 as illustrated in FIGS. 7A and 7B. Seal frame 710 may be made of any suitable metal, such as copper, gold or silver, or a conductive material and have a sufficient thickness and width so that seal frame 710 may act as an inductor 720. Seal frame 710 may be electrically connected to one of the electrodes 618 or 620 of resonator 608 in order to provide electrical coupling of inductor 720 with resonator 608. In an embodiment, cap 604 may include an electrical connection, such as a through substrate via 742, in order to enable electrical connection to inductor 720 through cap 604. In an embodiment, through substrate via 742 couples a contact pad 744 on the AWR die side of cap 604 to a contact pad 746 on the external side of cap 604 as illustrated in FIG. 7A. In an embodiment, contact pad 744 may be coupled to a corresponding contact pad 748 on AWR die 602 which is electrically coupled to seal frame 710 as illustrated in FIG. 7B.

In an embodiment, seal frame 710/inductor 720 may have a portion 730 fabricated on AWR die 602 and a portion 732 fabricated on cap 604. AWR die portion 730 and cap portion 732 may be bonded together by direct metal to metal bonding, for example, by diffusion bonding, or by an intervening solder layer 634, such as a lead free tin bismuth solder as illustrated in FIG. 7A. In this way, an inductor having a thickness greater than, for example, 30 microns may be fabricated in order to create an inductor 720 with a high quality factor (Q), such as greater than 80. In an embodiment, seal frame 710 may have a thickness between 20 to 80 microns. In an embodiment, the die portion 730 is thicker than the cap portion 732.

In an embodiment, inductor 720 may be used to as an inductor in a hybrid filter, such as in hybrid filters 100-500 of FIGS. 1-5. In an embodiment, inductor 720 may be part of a transformer used in a hybrid filter, such as hybrid filters 100-500 of FIGS. 1-5.

Figure 8A:
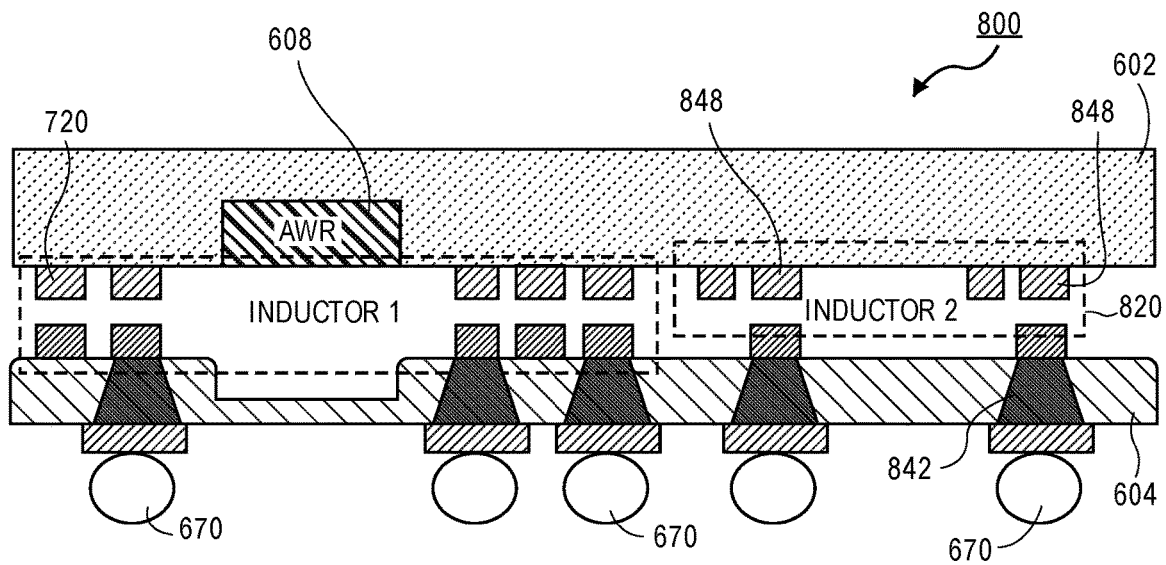
FIG. 8A and FIG. 8B illustrate a cross-sectional view and corresponding plan view of an acoustic wave resonator (AWR) device in accordance with an embodiment of the present disclosure.
Figure 8B:
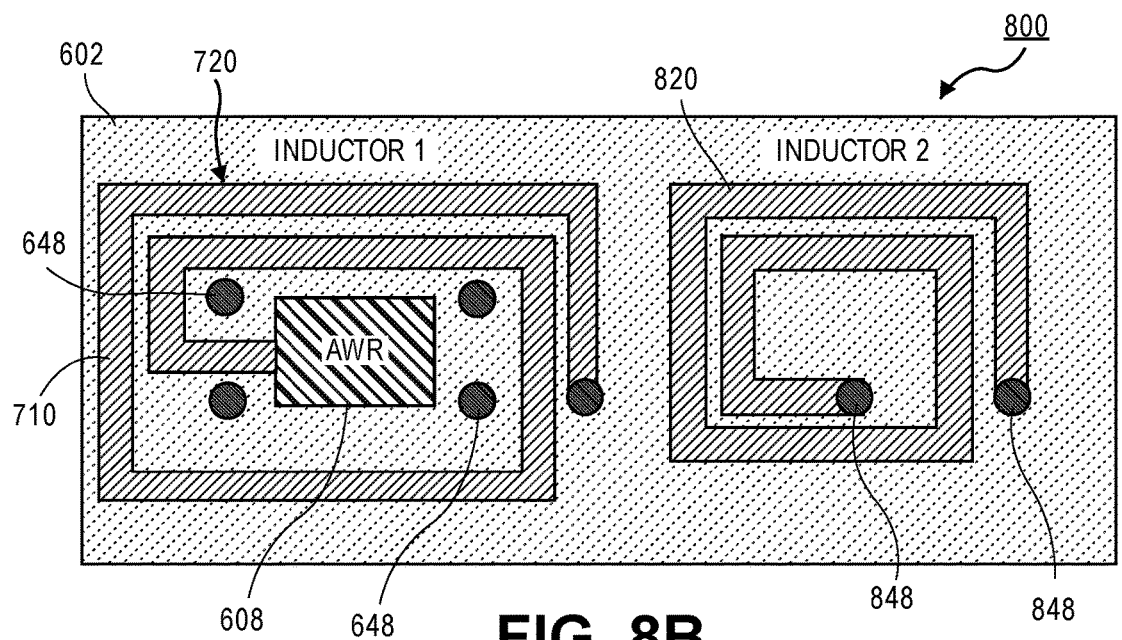

FIG. 8A and FIG. 8B illustrate an acoustic wave resonator (AWR) device 800 in accordance with an embodiment of the present disclosure. AWR device 800 is similar to AWR 700 but includes a second inductor 820. In an embodiment, inductor 820 is located adjacent to inductor 720 surrounding resonator 608. In an embodiment, inductor 820 is formed on the underside of AWR die 602 as illustrated in FIG. 8B. In an embodiment, inductor 820 may be formed of a suitable metal, such as gold, silver, and copper or other conductive materials. In an embodiment, inductor 820 is disposed only on AWR die 602 and not on cap 604 as illustrated in FIG. 8A. In an embodiment, inductor 820 may be a stacked inductor including a portion formed on AWR die 602 and a portion formed on cap 604, such as described with respect to inductor 720 of FIG. 7. In an embodiment, one of inductor 720 or inductor 820 is a stacked inductor while the other of inductor 720 or inductor 820 is not a stacked inductor. In an embodiment, inductor 820 may include one or more loops. In an embodiment, inductor 820 may be electrically coupled to an electrode of resonator 608, such as a same electrode to which inductor 720 is coupled. In an embodiment, inductor 820 may be coupled to an electrode of a second resonator 608 disposed on AWR die 602.

In an embodiment, inductor 720 and inductor 820 are disposed sufficiently close together, such as with a spacing between 10-30 microns, so that they may be sufficiently inductively coupled to create a first winding and a second winding of a transformer. In an embodiment, one or more electrical connections, such as through substrate vias 842, may be fabricated in cap 604 to enable electrical coupling of inductor 820 through cap 604 to external components, such as a package substrate.

Figure 9:
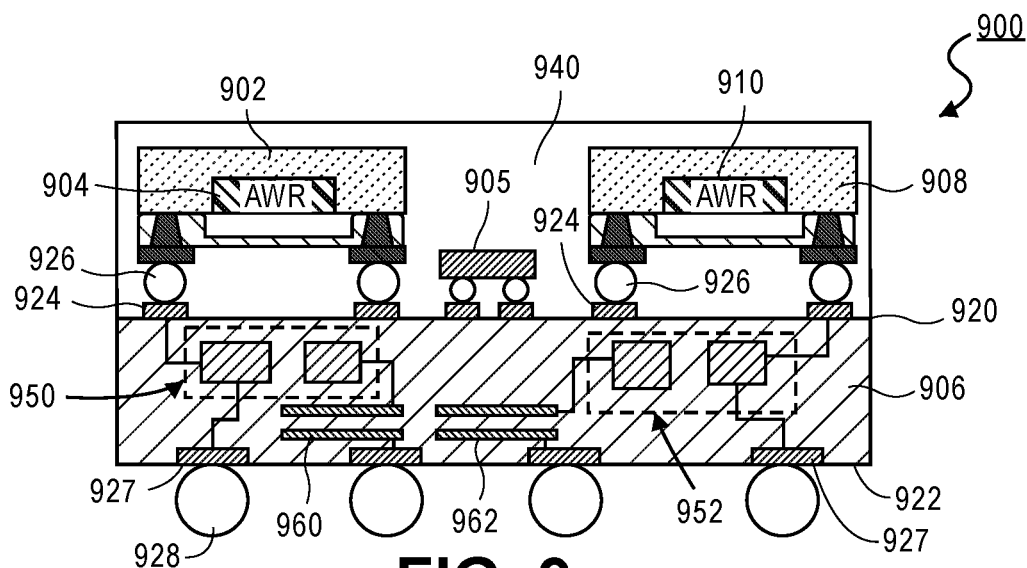
FIG. 9 illustrates a packaged hybrid filter in accordance with an embodiment of the present disclosure.

FIG. 9 illustrates a packaged hybrid filter 900 in accordance with an embodiment of the present disclosure. Packaged filter 900 includes an acoustic wave resonator (AWR) device 902 including an acoustic wave resonator (resonator) 904. AWR die 902 is electrically coupled to a package substrate 906, as illustrated in FIG. 9. In an embodiment, a second acoustic wave resonator (AWR) device 908 having a second acoustic wave resonator 910 may be electrically coupled to package substrate 906 as illustrated in FIG. 9. AWR device 902 and AWR device 908 may be any AWR device, such as but not limited to AWR device 600, AWR device 700 and AWR device 800 as described above.

In an embodiment, package substrate 906 has a device side 920 and a land side or a second level interconnect (SLI) side 922. A plurality of contact pads 924 are disposed on device side 920. AWR device 902 and AWR device 908 may be electrically coupled to bond pads 924, for example, by flip chip connections using bumps or solder balls 926. Land side 922 of package substrate 906 includes a plurality of contact pads or land pads 927. A plurality of second level contacts, such as solder balls or bumps 928 may be disposed on pads 927 to enable packaged filter 900 to be electrically coupled to other components, such as a motherboard or main board. Package substrate 906 may be any suitable package substrate. In an embodiment, package substrate 906 is an organic multilayer printed circuit board including a dielectric material such as but not limited to silicon filled epoxy, FR4, or polyimide. In another embodiment, package substrate is an inorganic package substrate such as a ceramic substrate, such as a low temperature co-fired ceramic substrate or a high temperature co-fired ceramic substrate, a glass substrate (e.g., silicon oxide), or a semiconductor substrate (e.g., silicon). In an embodiment, package substrate 906 is a multilayer package substrate which includes a plurality of metallization layers, such as copper layers, each comprising a plurality electrical traces or power planes. Each metallization layer may be separated from an adjacent metal layer by one or more dielectric layers. Conductive vias, such as copper vias, may be disposed in the dielectric layers to enable electrical connection from one metallization to another. In an embodiment, a mold material or an overmold or an encapsulation 940 is deposited over and between AWR die 902 and AWR die 908, as shown in FIG. 9. In an embodiment, the mold material may be formed between AWR die 904 and package substrate 906 and between AWR 908 and package substrate 906 and may surround contacts 926, as illustrated in FIG. 9. In an embodiment, overmold material may comprise an epoxy or resin.

In an embodiment, package substrate 906 includes one or more inductors, such as inductors 950 and 952 embedded therein, as illustrated in FIG. 9. Inductors 950 and 952 may be partial loop inductors, single loop inductors or a multi loop inductors fabricated in a single level or a multiple levels of package substrate 906, as described in more detail with respect to FIGS. 14A-14F. In an embodiment, inductor 950 or 952 may consist of one or more turns of conductive material, such as copper, separated by a dielectric such as a polymer, a ceramic, a glass, or air. In one embodiment, the one or more turns of conductive material are separated by the material of package substrate 906. In an embodiment, inductor 950 is electrically coupled by an electrical connection to resonator 904, of AWR device 902 as illustrated in FIG. 9. In an embodiment, inductor 952 is electrically coupled by an electrical connection to resonator 910 of AWR die 908 as illustrated in FIG. 9.

In an embodiment, package substrate 906 may include one or more capacitors, such as capacitors 960 and 962, embedded therein. Capacitors 960 and 962 may be parallel plate capacitors or interdigitated capacitors and may be fabricated in a single layer or multiple layers of a package substrate 906 as described in more detail in FIGS. 13A-13B. In an embodiment, capacitor 960 may be electrically coupled by an electrical connection to resonator 904 of AWR die 902 and/or to inductor 950. In an embodiment, capacitor 962 may be electrically coupled by an electrical connection to inductor 952. In an embodiment of the present disclosure, resonator 904 of AWR die 902 has a first resonance frequency or bandwidth and resonator 910 of AWR 908 has a second resonance frequency or bandwidth which is different than the first resonance frequency or bandwidth. In an embodiment, one or more surface mount capacitors 905 may be coupled to device side 920 of package substrate 906. In an embodiment, package substrate 906 may include one or more antennas.

In an embodiment of the present disclosure, inductors 950 and 952 may be part of a network of inductors which create a transformer equivalent circuit, such as a Pi-network or a T-network as described above. In an embodiment of the present disclosure, package hybrid filter 900 includes all of the passive devices, acoustic wave resonators and couplings thereto that create hybrid filter 200 or hybrid filter 300 described above.

Figure 10:
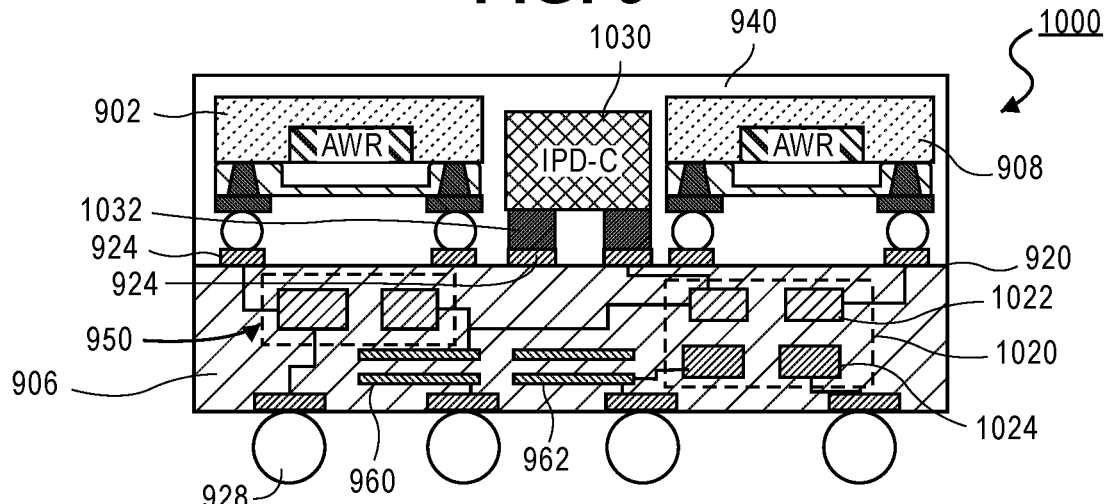
FIG. 10 is an illustration of a packaged hybrid filter in accordance with an embodiment of the present disclosure.

FIG. 10 is an illustration of a packaged hybrid filter 1000 in accordance with an embodiment of the present disclosure. Packaged filter 1000 is similar to packaged filter 900, however, filter 1000 includes a transformer, such as transformer 1020, embedded in package substrate 906. In an embodiment, transformer 1020 includes a first winding 1022 and a second winding 1024 where the first winding 1022 and second winding 1024 are inductively coupled. In an embodiment, first winding 1022 is vertically above second winding 1024, as illustrated in FIG. 10. In an embodiment, first winding 1022 and second winding 1024 are substantially vertically aligned with one another. In another embodiment, first winding 1022 has a central axis which is slightly offset from a central axis of second winding 1024 in order to reduce the coupling coefficient of transformer 1020. In an embodiment, first winding 1022 is a planar winding fabricated in a single metal layer of package substrate 906 and second winding 1024 is a planar winding fabricated in a single different metal layer of package substrate 906. In an embodiment, first winding 1022 is separated from second winding 1024 by a vertical distance from between 15 microns to 60 microns. In an embodiment, first winding 1022 and second winding 1024 may each be fabricated in multiple metal layers in package substrate 906 in order to create high quality factor (high Q) inductors for transformer 1020. In an embodiment, first winding 1022 may be electrically coupled to a capacitor, such as capacitor 960, embedded within package substrate 906. In an embodiment, second winding 1024 may be electrically coupled to a capacitor, such as capacitor 962, embedded in package substrate 906.

In an embodiment, hybrid filter 1000 may include one or more integrated passive devices (IPD) 1030 coupled to package substrate 906, as illustrated in FIG. 10. In an embodiment, IPD 1030 may be bonded to contact pads 924 on die side 920 of package substrate 906 by a plurality of contacts 1032, such as solder balls or bumps. IPD 1030 may include one or more capacitors, resistors, or inductors disposed therein. IPD 1030 may be fabricated with a process which enables high quality inductors or capacitors to be formed therein. IPD 1030 may be particularly beneficial when package substrate 906 is fabricated or is a type of substrate, such as a high density interconnect (HDI) printed circuit board, in which making high quality capacitors and inductors may be too difficult or expensive. In an embodiment, IPD 1030 contains only passive devices and does not include any active devices, such as transistors and/or amplifiers. In an embodiment, IPD 1032 contains only capacitors.

In an embodiment, IPD 1030 is coupled to die side 920 of package substrate 906 and is located between AWR device 902 and AWR device 908 as illustrated in FIG. 10. In an embodiment, molding material 940 may be disposed over IPD 1030 and in an embodiment, molding material 940 may be formed between IPD 1030 and package substrate 906 as illustrated in FIG. 10. In an embodiment, IPD 1030 is fabricated from a glass substrate or a semiconductor substrate, such a silicon substrate. In an embodiment, IPD 1030 may include an interconnect structure disposed on the substrate.

In an embodiment, packaged hybrid filter 1000 includes inductors, capacitors, acoustic wave resonators, and a transformer with appropriate electrical couplings thereto to create a hybrid filter, such as hybrid filters 100, 300, 400 and 500, as described above.

Figure 11:
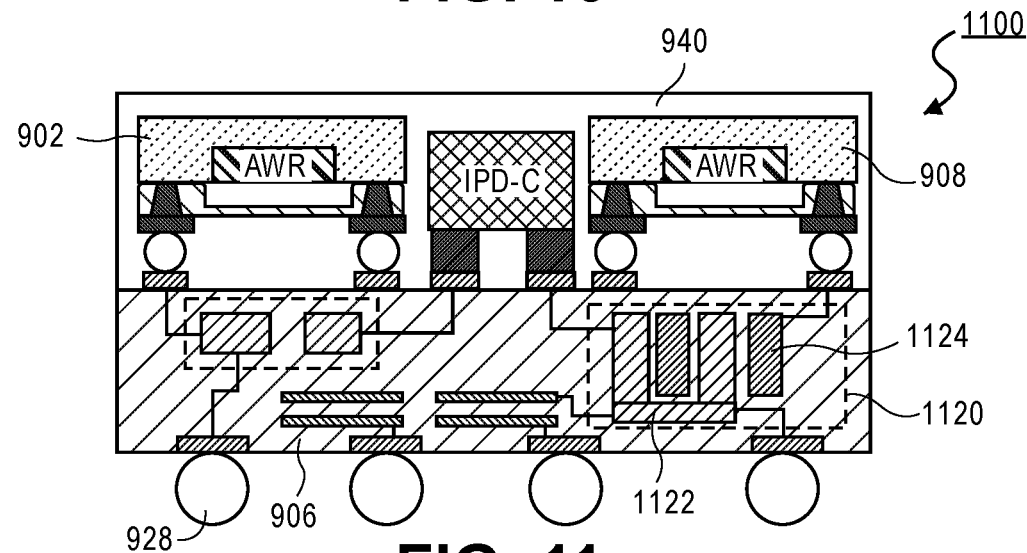
FIG. 11 is an illustration of a packaged hybrid filter, in accordance with an embodiment of the present disclosure.

FIG. 11 is an illustration of a packaged hybrid filter 1100, in accordance with an embodiment of the present disclosure. Hybrid filter 1100 is similar to hybrid filter 1000 except that it includes a vertical transformer 1120 instead of transformer 1020. In an embodiment, vertical transformer 1120 includes a first winding 1122 and a second winding 1124. Both first winding 1122 and second winding 1124 may be fabricated in multiple metal layers of package substrate 906. In an embodiment, first winding 1122 and second winding 1124 may be interleaved with one another, as illustrated in FIG. 11. In an embodiment, the vertical transformer 1120 has an implementation where the vertical axes of the first winding 1122 and the second winding 1124 are not aligned and are offset to provide a mutual coupling adjustment.

Figure 12:
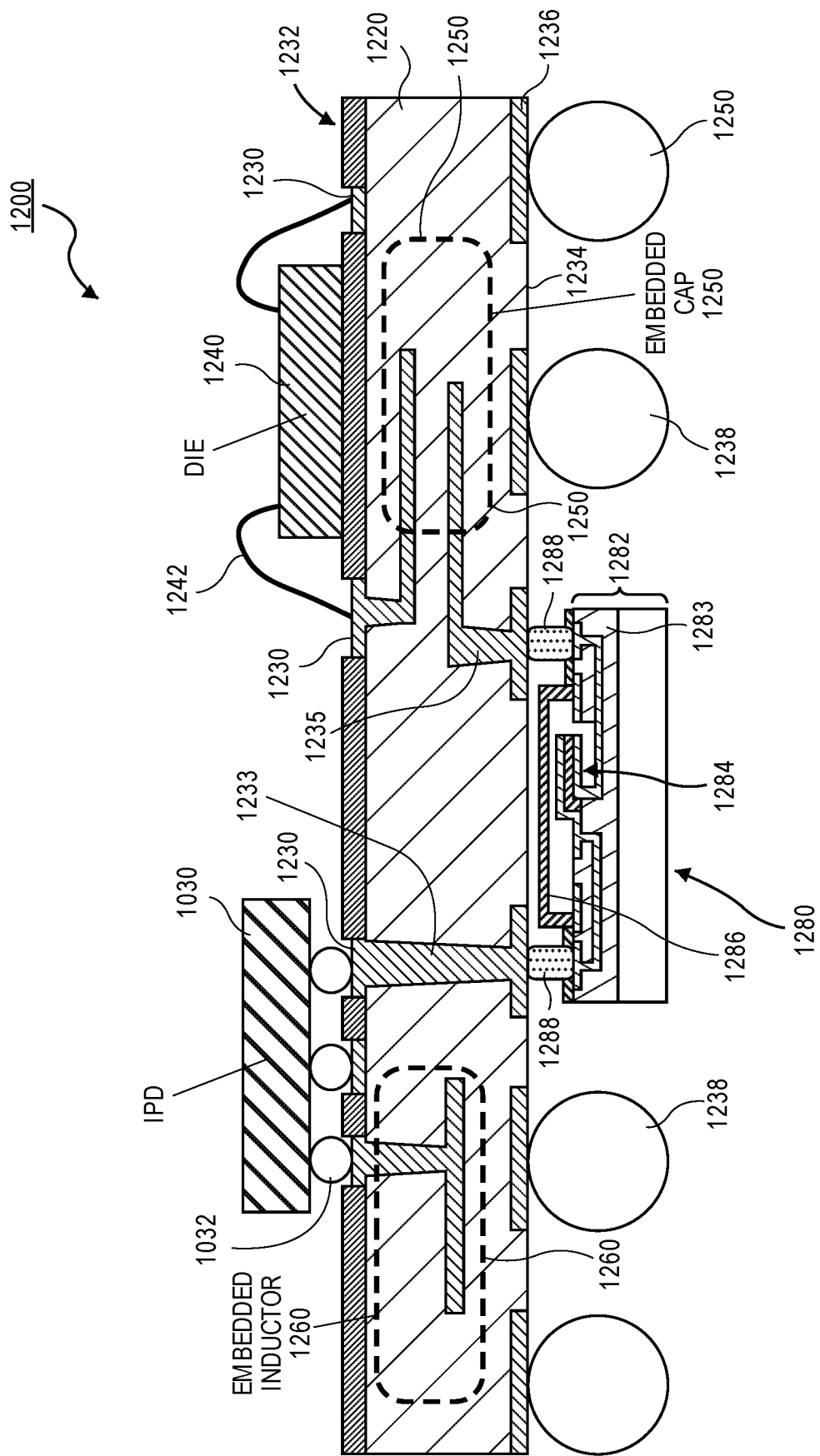
FIG. 12 is a system such as a front end system or module, in accordance with embodiments of the present disclosure.

FIG. 12 is a system 1200, such as a front end system or module, in accordance with embodiments of the present disclosure. System 1200 may include active circuitry and passive circuitry, such as a hybrid filter described above. System 1200 includes a package substrate 1220 such as a multilayer package substrate as described above. Package substrate 1220 may include a plurality of contact pads 1230 located on an active die side 1232 of package substrate 1220 as shown in FIG. 12. An integrated passive device, such as IPD 1030, may be bonded to contact pads 1230 by a corresponding contact 1032, as illustrated in FIG. 12. An active die 1240 may be attached to active device die side 1232 of package substrate 1220 and may be electrically coupled to contact pads 1230 by a corresponding electrical contact 1242, such as a wire bond. Alternatively, active die 1240 may be electrically coupled to contact pads 1230 by, for example, flip chip connections. In an embodiment, active die 1240 includes active devices and circuitry, such as RF front end active circuits, such as but not limited to transistors, amplifiers and switches. In an embodiment, active die 1240 includes a semiconductor substrate, such as but not limited to a group III-V semiconductor substrate, a silicon on insulator (SOI) substrate and a bulk monocrystalline silicon substrate. One or more capacitors 1250 may be embedded within package substrate 1220 as illustrated in FIG. 12, and described further with respect to FIGS. 13A and 13B. Similarly, one or more inductors 1260 may be embedded in package substrate 1220, as illustrated in FIG. 12 and described further with respect to FIG. 14A-14F. Inductors 1260 may be stand-alone inductors or may be part of a transformer or transformer equivalent network.

Package substrate 1220 has a back side or land side or second level interconnect (SLI) side 1234 opposite the active device side 1232. SLI side 1234 may include a plurality of contacts or land pads 1236. A plurality of electrical contacts 1238 may be disposed on corresponding plurality of contacts pads 1236 to enable package substrate 1220 to be electrically connected to other components, such as a printed circuit board or a mainboard.

An acoustic wave resonator (AWR) device 1280 may be attached to backside 1234 of package substrate 1220 as illustrated in FIG. 12. AWR device 1280 may be similar to AWR devices 600, 700 and 800 as described above. AWR device 1280 may include an AWR die 1282 having an acoustic wave resonator (resonator) 1284. A cap 1286 may be attached to AWR die 1282 by, for example, a seal frame or a ring to hermetically and acoustically seal resonator 1284 therein. In an embodiment, AWR device 1280 is electrically coupled to contact pads 1236 by electrical connections 1288, such as flip-chip connections. In an embodiment, electrical connections 1288 are located outside the perimeter of cap 1280 and electrical connections to electrodes of resonator 1284 are provided by a metallization layer disposed in an interconnect system 1283 which extends beneath cap 1286 to resonator 1284, as illustrated in FIG. 12. In an embodiment, no electrical connections are disposed within or through cap 1286, as is illustrated in FIG. 12. By placing AWR device 1280 on the backside 1234 of package substrate 1220, only vertical vias, such as through substrate vias, are needed between AWR device 1280 and other system components, such as high quality passives on IPD 1030, capacitors 1250 or inductor 1260 embedded within package substrate 1220, or active semiconductor die 1240. For example, as illustrated in FIG. 12, a vertical via 1233, such as a through substrate via may be used to directly couple AWR device 1280 to IPD 1030. Similarly, a single and vertical via may directly couple AWR device 1280 to embedded capacitor 1250. Due to the flip chip placement of AWR device 1280 on the backside of package substrate 1220, only short connections are needed for interconnections which reduces parasitics and eases assembly and fabrication.

Figure 13A:
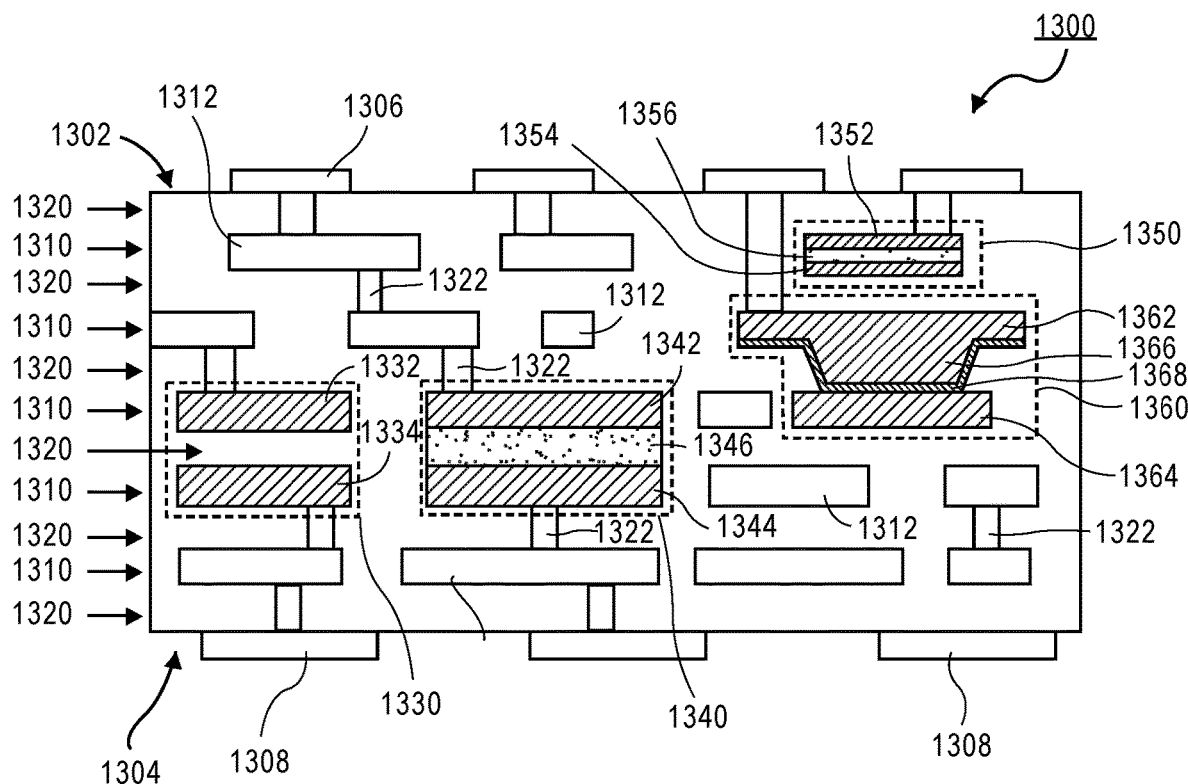
FIG. 13A and FIG. 13B illustrate various capacitors which may be integrated or embedded into a package substrate, in accordance with embodiments of the present disclosure.
Figure 13B:
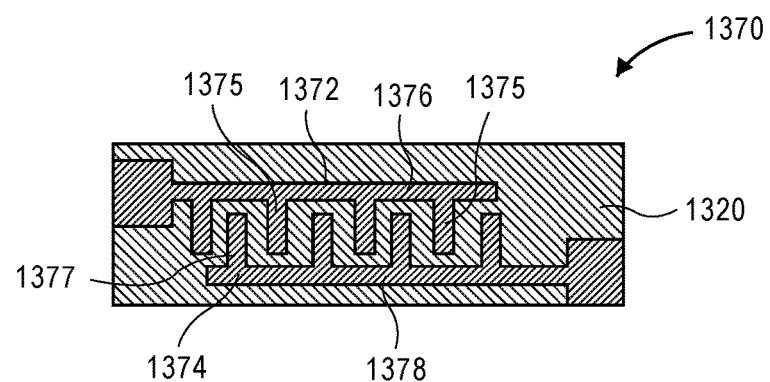

FIG. 13A and FIG. 13B illustrate various capacitors which may be integrated or embedded into a package substrate, in accordance with embodiments of the present disclosure. In embodiments, capacitors are thin film structures consisting of metal electrodes and a low loss tangent dielectric material between the electrodes. The quality factor of the capacitors increases with decreasing loss tangent of the dielectric material employed. The capacitor dielectric material may have a high dielectric constant to reduce the footprint of the capacitor. FIG. 13A is a cross sectional illustration of a multilayer package substrate 1300, such as a multilayer organic package substrate or a low temperature co-fired substrate. Substrate 1300 includes a first side 1302 and a second side 1304 opposite the first side 1302. A plurality of contact pads 1306 may be disposed on first side 1302 and a plurality of contact pads 1308 may be disposed on second side 1304. Multilayer substrate 1300 includes a plurality of metal layers 1310, such as copper layers. Each of the metal layers 1310 includes a plurality of metal traces or conductors 1312. A plurality of dielectric layers 1320, such as silicon oxide, aluminum oxide, or epoxy with silicon oxide or aluminum oxide fillers or FR4 or polyimide, are disposed between metal layers 1310 to electrically isolate the metal layers 1310 from one another. Dielectric layers 1320 may also be disposed between traces 1312 of metal layers 1310. A plurality of conductive vias 1322, such as copper vias, may be disposed in dielectric layers 1320 to enable electrical connections between adjacent metal layers 1310.

In an embodiment, package substrate 1300 may include a parallel plate capacitor 1330 which includes a first electrode or plate 1332 formed in one metal layer 1310 and a second electrode or plate 1334 formed in a second vertically adjacent metal layer 1310. In an embodiment, a portion of the dielectric layers 1320 between first electrode or plate 1332 and second electrode or plate 1334 forms the capacitor dielectric layer of capacitor 1330.

In an embodiment, package substrate 1300 may include one or more parallel plate capacitors 1340 which includes a first electrode or plate 1342 formed in one metal layer 1310 and a second electrode or plate 1344 disposed in a second vertically adjacent metal layer 1310. Capacitor 1340 may include a capacitor dielectric 1346 formed of a dielectric material which is different than the dielectric material 1320 used to isolate the metal layers 1310 of package substrate 1300. In an embodiment, dielectric 1346 is a high dielectric constant material, such as a metal oxide dielectric material, e.g., aluminum oxide, zirconium oxide, hafnium oxide, barium titanate (BTO), barium strontium titanate (BST), or lead zirconate titanate (PZT). In an embodiment, dielectric 1346 is a low loss tangent dielectric material. In this way, a high performance capacitor may be fabricated.

In an embodiment, package substrate 1300 may include one or more parallel plate capacitors 1350. Capacitor 1350 includes a first electrode or plate 1352, a second electrode or plate 1354 and an intervening capacitor dielectric 1356 disposed there between. In an embodiment, capacitor 1350 is disposed in a single metal layer 1310 of substrate 1300 as illustrated in FIG. 13A. In an embodiment, capacitor dielectric 1356 may be formed from a dielectric material having a high dielectric constant, such as a high k dielectric and which is different than the dielectric material 1320 used to form package substrate 1300. In an embodiment, dielectric 1356 is a high dielectric constant material, such as a metal oxide dielectric material, e.g., aluminum oxide, zirconium oxide, hafnium oxide, barium titanate (BTO), barium strontium titanate (BST), or PZT. In an embodiment, dielectric 1356 is a low loss tangent dielectric material. In this way, a high performance capacitor may be fabricated.

In an embodiment, package substrate 1300 may include one or more capacitors 1360 as illustrated in FIG. 13A. Capacitor 1360 includes a top electrode 1362 and a bottom electrode 1364. Top electrode 1362 includes a via portion 1366. Via portion 1366 is separated from bottom electrode 1364 by a capacitor dielectric 1368. Capacitor dielectric 1368 may be deposited in a via opening prior to filling the via with a conductive material, such as copper. In an embodiment, capacitor dielectric 1368 is a high k dielectric layer, such as a metal oxide, such as hafnium oxide or aluminum oxide. In an embodiment, capacitor dielectric 1368 is a low loss dielectric material. In an embodiment, capacitor dielectric 1368 is a different dielectric material than dielectric material 1320. In an embodiment, capacitor dielectric 1368 is a high dielectric constant material, such as a metal oxide dielectric material, e.g., aluminum oxide, zirconium oxide, hafnium oxide, barium titanate (BTO), barium strontium titanate (BST), or PZT. In an embodiment, capacitor dielectric 1368 is a low loss tangent dielectric material. In this way, a high performance capacitor may be fabricated.

FIG. 13B illustrates a plan view of a capacitor 1370 which may be embedded in package substrate 1300 in accordance with embodiments of the present disclosure. Capacitor 1370 includes a first electrode 1372 and a second electrode 1374. First electrode 1372 includes a plurality of fingers 1375 extending from a back bone 1376 which are interleaved or interdigitated with a plurality of fingers 1377 extending from a back bone 1378 of second electrode 1374 as illustrated in FIG. 13B. In an embodiment, first electrode 1372 and second electrode 1374 are disposed in a same metal layer 1310 or plane of package substrate 1300. Dielectric layer 1320 disposed between the back bone and fingers of the electrodes may act as a capacitor dielectric. In an embodiment, dielectric material 1320 disposed between the electrodes may be replaced with a different dielectric material, such as a high k dielectric material and/or a low loss tangent dielectric material, if desired.

FIGS. 14A-14F illustrate various inductors which may be embedded into a package substrate in accordance with embodiments of the present disclosure. FIG. 14A is a cross-sectional illustration of package substrate 1300 which in an embodiment may include one or more inductors formed from one or more metal layers 1310 of package substrate 1300. In an embodiment, package substrate 1300 may include one or more inductors 1410. In an embodiment, inductor 1410 has a loop disposed in a single metal layer 1310 of package substrate 1300. Inductor 1410 may have a partial or fractional loop, as illustrated in FIG. 14B, a full loop, as illustrated in FIG. 14C, or multiple loops, such as two or more loops as illustrated in FIG. 14D.

In an embodiment, package substrate 1300 may include one or more inductors 1420. Inductor 1420 may include one or more loops including a first metal portion 1422 disposed in a first metal layer 1310 of package substrate 1300 and a second metal portion 1424 disposed in a second metal layer 1310 vertically adjacent to the first metal layer 1310. The first metal portion 1422 is electrically coupled to the second metal portion 1424 by a plurality of metal vias 1426, as illustrated in FIG. 14A. In this way, an inductor 1420 may have a loop with a metal thickness greater than the metal thickness of a single metal layer 1310 of package substrate 1300 and thereby yield a high Q inductor. By increasing the thickness of the conductors of inductor 1420, an inductor having a Q factor of 100 or better at the frequency of operation may be achieved.

FIG. 14E is a plan view of inductor 1420 showing a top portion 1422 of a loop and the underlying vias 1426 electrically connected thereto. Dielectric material 1320 may be disposed between conductive vias 1426 and between the first metal portion 1422 and a second metal portion 1424. If desired, inductor 1420 may include a third metal portion disposed in a third metal layer 1310 and be electrically connected to second metal portion 1424 by a second plurality of conductive vias. In an embodiment of the present disclosure, the plurality of conductive vias 1426 and 1322 may be formed by laser drilling a plurality of via openings in the dielectric layer 1310 and then filling the vias with a conductive material, such as copper, when forming the metal layer 1310 above. Laser drilling provides a cost effective method of creating vias 1426 and 1322.

In an embodiment, package substrate 1300 may include one or more inductors 1430 as illustrated in FIG. 14A. Inductor 1430 includes a first metal portion 1432 disposed in a first metal layer 1310 and a second metal portion 1434 disposed in a second metal layer 1310 vertically adjacent to the first metal layer 1310. A slot via or trench via 1436 may be used to connect first metal portion 1432 with second metal portion 1434. Trench via 1434 may have a length substantially equal to, or at least 90% of, the length of the loop or loops included in metal portions 1432 and 1434, as illustrated in FIG. 14F. In an embodiment, trench via 1436 has a width which is less than the width of metal portions 1432 and 1434. Trench vias 1436 may be formed by lithographically patterning a trench opening in dielectric layer 1320 by, for example, lithographically patterning a photoresist mask and then etching a trench opening in alignment with the photoresist mask. Alternatively, dielectric layer 1320 may be a photo definable dielectric and may be directly photo defined to form a trench opening therein. The trench opening may be subsequently filled when forming metal layer 1310 which includes metal portion 1432.

Inductor 1430 may be able to exhibit a higher Q factor than inductor 1420 because inductor 1430 has a trench via which substantially or completely connects the metal portion 1432 with the metal portion 1434 while inductor 1420 is coupled by vias and has dielectric 1320 between metal portions 1422 and 1424, as illustrated in FIG. 14E.

It is to be appreciated that inductors such as inductors 1410, 1420 and 1430 may be stand-alone inductors or may be combined with other inductors to fabricate windings of a transformer or a transformer-equivalent circuit.

Figure 15:
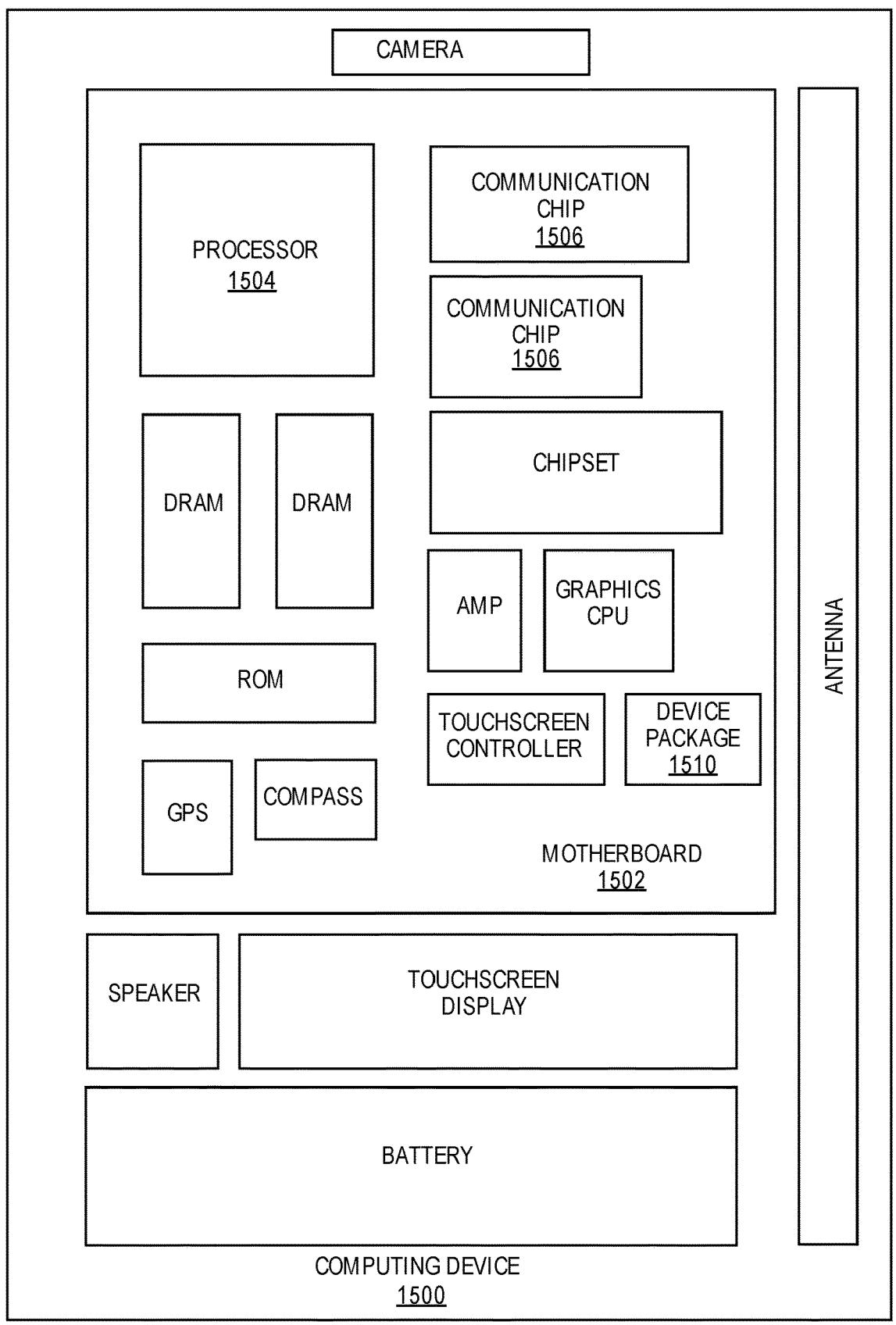
FIG. 15 is a schematic block diagram illustrating a computer system that utilizes a hybrid filter, a packaged hybrid filter, an acoustic wave resonator (AWR) device, or a combination thereof, as described herein, in accordance with an embodiment of the present disclosure.

FIG. 15 is a schematic block diagram illustrating a computer system that utilizes a hybrid filter, a packaged hybrid filter, an acoustic wave resonator (AWR) device, or a combination thereof, as described herein, in accordance with an embodiment of the present disclosure. FIG. 15 illustrates an example of a computing device 1500. Computing device 1500 houses motherboard 1502. Motherboard 1502 may include a number of components, including but not limited to processor 1504, device package 1510, and at least one communication chip 1506. Processor 1504 is physically and electrically coupled to motherboard 1502. For some embodiments, at least one communication chip 1506 is also physically and electrically coupled to motherboard 1502. For other embodiments, at least one communication chip 1506 is part of processor 1504.

Depending on its applications, computing device 1500 may include other components that may or may not be physically and electrically coupled to motherboard 1502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 1506 enables wireless communications for the transfer of data to and from computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 1506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

Processor 1504 of computing device 1500 includes an integrated circuit die packaged within processor 1504. Device package 1510 may be, but is not limited to, a packaging substrate and/or a printed circuit board. Note that device package 1510 may be a single component, a subset of components, and/or an entire system.

For some embodiments, the integrated circuit die may be packaged with one or more devices on device package 1510 that include a thermally stable RFIC and antenna for use with wireless communications. The term "processor" may refer to any device or portion of a device that processes electronic data from registers and/or memory to transform that electronic data into other electronic data that may be stored in registers and/or memory.

At least one communication chip 1506 also includes an integrated circuit die packaged within the communication chip 1506. For some embodiments, the integrated circuit die of the communication chip may be packaged with one or more devices on the device package 1510, as described herein.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A filter includes a first port and a second port. A first acoustic wave resonator (AWR) having a first electrode is coupled to the first port and a second electrode coupled to ground. A first inductor having a first terminal is coupled to the first port and a second terminal coupled to a first node. A first capacitor having a first electrode is coupled to the first port and a second electrode coupled to the first node. A second capacitor having a first electrode is coupled to the first node. A transformer having a first winding having a first terminal is coupled to the first node and a second terminal coupled to ground and having a second winding having a first terminal coupled to a second node and a second terminal coupled to ground. A third capacitor having a first electrode is coupled to the second node. A second acoustic wave resonator (AWR) having a first electrode is coupled to the second node and a second electrode coupled to the second port.

Example Embodiment 2

The filter of example embodiment 1 further comprising a second inductor having a first terminal coupled to the first port and a second terminal coupled to ground.

Example Embodiment 3

The filter of example embodiment 2 wherein the first terminal of the second AWR is coupled to the second node through a third inductor.

Example Embodiment 4

The filter of example embodiment 1, 2 or 3 wherein a second electrode of a second capacitor is coupled to ground, and wherein a second electrode of the third capacitor is coupled to ground.

Example Embodiment 5

The filter of example embodiment 1, 2, 3 or 4 further comprising a fourth capacitor having a first electrode coupled to the first node and a second electrode coupled to the second node.

Example Embodiment 6

The filter of example embodiment 1 wherein the first AWR is coupled to ground through a fourth inductor, and wherein the fourth inductor has a first terminal coupled to the second terminal of the first AWR and a second terminal coupled to ground.

Example Embodiment 7

The filter of example embodiment 1 further comprising a third acoustic wave resonator (AWR) having a first terminal coupled to the first port and a second terminal coupled to ground.

Example Embodiment 8

The filter of example embodiment 7 wherein the first AWR has a first resonance frequency and the second AWR has a second resonance frequency which is offset from the first resonance frequency.

Example Embodiment 9

The filter of example embodiment 7 further comprising a fourth acoustic wave resonator (AWR) having a first electrode coupled to the first port and a second electrode coupled to ground.

Example Embodiment 10

The filter of example embodiment 9 wherein the first AWR has a first resonance frequency, the third AWR has a second resonance frequency and the fourth AWR has a third resonance frequency, wherein the second resonance frequency is offset from the first resonance frequency and the third resonance frequency is offset from the first resonance frequency and the second resonance frequency.

Example Embodiment 11

The filter of example embodiment 1 wherein the second terminal of the first winding is connected to the second terminal of the second capacitor, and wherein the second terminal of the second winding is connected to the second terminal of the third capacitor.

Example Embodiment 12

The filter of example embodiment 1 where one of the first capacitor, the second capacitor, or the third capacitor comprises a plurality of capacitors coupled together in parallel.

Example Embodiment 13

The filter of example embodiment 3 wherein one of the first inductor, the second inductor or the third inductor comprises a plurality of inductors coupled together in series.

Example Embodiment 14

The filter of example embodiment 1 wherein the first AWR and second AWR are selected from the group consisting of a FBAR, a SMR, a CMR, a CLMR, and SAW device.

Example Embodiment 15

A filter includes a first port and a second port. A first acoustic wave resonator (AWR) having a first electrode is coupled to the first port and a second electrode coupled to ground. A first inductor having a first terminal is coupled to the first port and a second terminal coupled to a first node. A first capacitor having a first electrode is coupled to the first port and a second electrode coupled to the first node. A second capacitor having a first electrode is coupled to the first node. A second inductor having a first terminal is coupled to the first node and a second terminal coupled to a first terminal of a third inductor, the third inductor having a second terminal coupled to ground. A fourth inductor having a first terminal is coupled to a second node, the fourth inductor having a second terminal coupled to the second terminal of the second inductor and to the first terminal of the third inductor. A third capacitor having a first electrode is coupled to the second node. A second acoustic wave resonator (AWR) having a first electrode is coupled to the second node and a second electrode coupled to the second port.

Example Embodiment 16

The filter of example embodiment 15 further comprising a fifth inductor having a first terminal coupled to the first port and a second terminal coupled to ground.

Example Embodiment 17

The filter of example embodiment 16 wherein the first terminal of the second AWR is coupled to the second node through a sixth inductor.

Example Embodiment 18

A filter includes a first port and a second port. A first acoustic wave resonator (AWR) having a first electrode is coupled to the first port and a second electrode coupled to ground. A first inductor having a first terminal is coupled to the first port and a second terminal coupled to a first node. A first capacitor having a first electrode is coupled to the first port and a second electrode coupled to the first node. A second capacitor having a first electrode is coupled to the first node. A second inductor having a first terminal is coupled to the first node and a second terminal coupled to ground. A third inductor having a first terminal is coupled to the first node and a second terminal coupled to a second node. A fourth inductor having a first terminal is coupled to the second node and a second terminal coupled to ground. A third capacitor having a first electrode is coupled to the second node. A second acoustic wave resonator (AWR) having a first electrode is coupled to the second node and a second electrode coupled to the second port.

Example Embodiment 19

The filter of example embodiment 18 further comprising a fifth inductor having a first terminal coupled to the first port and a second terminal coupled to ground.

Example Embodiment 20

The filter of example embodiment 19 wherein the first terminal of the second AWR is coupled to the second node through a sixth inductor.

Example Embodiment 21

A packaged filter includes a package substrate, the package substrate having a first side and a second side, the second side opposite the first side. A first acoustic wave resonator (AWR) device is coupled to the package substrate, the first AWR device comprising a resonator. A plurality of inductors is in the package substrate.

Example Embodiment 22

The packaged filter of example embodiment 21 further comprising a second acoustic wave resonator (AWR) device coupled to the package substrate, the second AWR device comprising a resonator.

Example Embodiment 23

The packaged filter of example embodiment 21 or 22 wherein the first AWR device comprises a plurality of resonators.

Example Embodiment 24

The packaged filter of example embodiment 21, 22 or 23 further comprising a plurality of capacitors in the package substrate.

Example Embodiment 25

The packaged filter of example embodiment 24 wherein one of the capacitors of the plurality of capacitors is coupled to an electrode of the resonator of the first AWR device.

Example Embodiment 26

The packaged filter of example embodiment 25 wherein one of the inductors of the plurality of inductors is coupled to the electrode.

Example Embodiment 27

The packaged filter of example embodiment 22 wherein one of the inductors of the plurality of inductors is coupled to an electrode of the resonator of the second AWR device.

Example Embodiment 28

The packaged filter of example embodiment 21, 22, 23, 24, 25, 26 or 27 wherein three or more of the plurality of inductors form an equivalent circuit of an RF transformer.

Example Embodiment 29

The packaged filter of example embodiment 21, 22, 23, 24, 25, 26, 27 or 28 further comprising an integrated passive device (IPD) coupled to the first side of the package substrate.

Example Embodiment 30

The packaged filter of example embodiment 21, 22, 23, 24, 25, 26, 27, 28 or 29 further comprising a transformer disposed within the package substrate.

Example Embodiment 31

The packaged filter of example embodiment 30 wherein the transformer is a two layer transformer having a first winding in a first layer of the package substrate and a second winding in a second layer of the package substrate, the second layer different than the first layer.

Example Embodiment 32

The packaged filter of example embodiment 30 or 31 wherein the transformer comprises a vertical transformer formed in two or more conductive layers of the package substrate.

Example Embodiment 33

The packaged filter of example embodiment 32 wherein the vertical transformer has an angle offset for mutual coupling adjustment.

Example Embodiment 34

A packaged filter includes a package substrate having a first side and a second side, the second side opposite the first side. An active die is coupled to the first side of the package substrate. An integrated passive device (IPD) is coupled to the first side of the package substrate. An acoustic wave resonator (AWR) device is coupled to the second side of the package substrate, the AWR device comprising a resonator. A plurality of contacts is on the second side of the package substrate.

Example Embodiment 35

The packaged filter of example embodiment 34 wherein the AWR device is directly coupled to the IPD by a vertical via interconnect.

Example Embodiment 36

The packaged filter of example embodiment 34 wherein the AWR device is attached to the second side of the package substrate by a plurality of flip chip connections.

Example Embodiment 37

The packaged filter of example embodiment 34 wherein the package substrate does not have a cavity formed therein.

Example Embodiment 38

The packaged filter of example embodiment 34 further comprising a plurality of capacitors embedded within the package substrate.

Example Embodiment 39

The packaged filter of example embodiment 34, 35, 36, 37 or 38 further comprising a plurality of inductors embedded within the package substrate.

Example Embodiment 40

The packaged filter of example embodiment 34, 35, 36, 37, 38 or 39 further comprising a transformer in the package substrate.

Example Embodiment 41

The packaged filter of example embodiment 34, 35, 36, 37, 38, 39 or 40 wherein the active die comprise active and passive circuitry.

Example Embodiment 42

The packaged filter of example embodiment 41 wherein the active circuitry includes one of an amplifier or a switch.

Example Embodiment 43

The packaged filter of example embodiment 34, 35, 36, 37, 38, 39, 40, 41 or 42 wherein the plurality of contacts surround the AWR device.

Example Embodiment 44

The packaged filter of example embodiment 43 wherein the plurality of contacts comprise a ball grid array (BGA).

Example Embodiment 45

An acoustic wave resonator device includes an acoustic wave resonator (AWR) die, the AWR die comprising a resonator. A seal frame is attached to the AWR die and surrounding the resonator. A cap having a first side is attached to the seal frame.

Example Embodiment 46

The acoustic wave resonator device of example embodiment of claim 45, wherein seal frame is a metal seal frame, and the metal seal frame forms an inductor, and wherein the inductor is coupled to an electrode of the resonator.

Example Embodiment 47

The acoustic wave resonator device of example embodiment 46 wherein the inductor is formed in a single plane.

Example Embodiment 48

The acoustic wave resonator device of example embodiment 46 wherein the inductor is a stacked inductor having a first portion on the AWR die bonded to a second portion on the cap.

Example Embodiment 49

The acoustic wave resonator device of example embodiment 46 wherein the inductor has a thickness between 15 to 80 microns.

Example Embodiment 50

The acoustic wave resonator device of example embodiment 45, 46, 47, 48 or 49 wherein the cap has a plurality of solder balls disposed on a second side of the cap, wherein the second side is opposite the first side.

Example Embodiment 51

The acoustic wave resonator device of example embodiment 50 further comprising a plurality of vias disposed through the cap wherein a corresponding one of the plurality of vias is coupled to a corresponding one of the plurality of solder balls.

Example Embodiment 52

The acoustic wave resonator device of example embodiment 45 further comprising a first plurality of contacts on a front side of the AWR die and a second plurality of contacts on the first side of the cap, wherein a corresponding one of the first plurality of contacts is attached to a corresponding one of the second plurality of contacts.

Example Embodiment 53

The acoustic wave resonator device of example embodiment 45 further comprising a cavity disposed in the first side of the cap, the cavity over the resonator.

Example Embodiment 54

The acoustic wave resonator device of example embodiment 45 wherein the seal frame comprises a first metal frame portion disposed on a front side of the AWR die and a second metal frame portion disposed on the first side of the cap, wherein the first metal frame portion is bonded to the second metal frame portion.

Example Embodiment 55

The acoustic wave resonator device of example embodiment 54 wherein the first metal frame portion is bonded to the second metal frame portion by a solder bond.

Example Embodiment 56

The acoustic wave resonator device of example embodiment 54 wherein the first metal frame portion is bonded to the second metal frame portion by a direct metal to metal bond.

Example Embodiment 57

The acoustic wave resonator device of example embodiment 46 further comprising a second inductor disposed on a front side of the AWR die.

Example Embodiment 58

The acoustic wave resonator device of example embodiment 57 wherein the inductor and the second inductor form a first winding and a second winding of a transformer, respectively.

Example Embodiment 59

The acoustic wave resonator device of example embodiment 57 wherein the second inductor is not attached to the first side of the cap.

Example Embodiment 60

The acoustic wave resonator device of example embodiment 45, 46, 47, 48, 49, 50, 51, 52, 53, 54, 55, 56, 57, 58 or 59 wherein the AWR die comprises a substrate and a multi-layer interconnect structure disposed on the substrate, and wherein a capacitor is within the multi-layer interconnect structure.

Example Embodiment 61

The acoustic wave resonator device of example embodiment 60 wherein the resonator is disposed with the multi-layer interconnect structure, and wherein an electrode of the capacitor is coupled to an electrode of the resonator.

What is claimed is:
1. A filter comprising:
   a first port and a second port;
   a first acoustic wave resonator (AWR) having a first electrode coupled to the first port and a second electrode coupled to ground;
   a first inductor having a first terminal coupled to the first port and a second terminal coupled to a first node;
   a first capacitor having a first electrode coupled to the first port and a second electrode coupled to the first node;
   a second capacitor having a first electrode coupled to the first node;
   a transformer having a first winding having a first terminal coupled to the first node and a second terminal coupled to ground and having a second winding having a first terminal coupled to a second node and a second terminal coupled to ground;
   a third capacitor having a first electrode coupled to the second node;
   a second acoustic wave resonator (AWR) having a first electrode coupled to the second node and a second electrode coupled to the second port; and
   a second inductor having a first terminal coupled to the first port and a second terminal coupled to ground, wherein the first terminal of the second AWR is coupled to the second node through a third inductor.
2. The filter of claim 1 wherein one of the first inductor, the second inductor or the third inductor comprises a plurality of inductors coupled together in series.
3. The filter of claim 1 wherein the first AWR and second AWR are selected from the group consisting of a FBAR, a SMR, a CMR, a CLMR, and SAW device.

4. The filter of claim 1 wherein a second electrode of the second capacitor is coupled to ground, and wherein a second electrode of the third capacitor is coupled to ground.

5. The filter of claim 1 further comprising a fourth capacitor having a first electrode coupled to the first node and a second electrode coupled to the second node.

6. The filter of claim 1 wherein the first AWR is coupled to ground through a fourth inductor, and wherein the fourth inductor has a first terminal coupled to the second terminal of the first AWR and a second terminal coupled to ground.

7. The filter of claim 1 further comprising a third acoustic wave resonator (AWR) having a first terminal coupled to the first port and a second terminal coupled to ground.

8. The filter of claim 7 wherein the first AWR has a first resonance frequency and the second AWR has a second resonance frequency which is offset from the first resonance frequency.

9. The filter of claim 7 further comprising a fourth acoustic wave resonator (AWR) having a first electrode coupled to the first port and a second electrode coupled to ground.

10. The filter of claim 9 wherein the first AWR has a first resonance frequency, the third AWR has a second resonance frequency and the fourth AWR has a third resonance frequency, wherein the second resonance frequency is offset from the first resonance frequency and the third resonance frequency is offset from the first resonance frequency and the second resonance frequency.

11. The filter of claim 1 wherein the second terminal of the first winding is connected to the second terminal of the second capacitor, and wherein the second terminal of the second winding is connected to the second terminal of the third capacitor.

12. The filter of claim 1 wherein one of the first capacitor, the second capacitor, or the third capacitor comprises a plurality of capacitors coupled together in parallel.

13. A filter comprising:
a first port and a second port;
a first acoustic wave resonator (AWR) having a first electrode coupled to the first port and a second electrode coupled to ground;
a first inductor having a first terminal coupled to the first port and a second terminal coupled to a first node;
a first capacitor having a first electrode coupled to the first port and a second electrode coupled to the first node;
a second capacitor having a first electrode coupled to the first node;
a transformer having a first winding having a first terminal coupled to the first node and a second terminal coupled to ground and having a second winding having a first terminal coupled to a second node and a second terminal coupled to ground, wherein the second terminal of the first winding is connected to the second terminal of the second capacitor;
a third capacitor having a first electrode coupled to the second node, wherein the second terminal of the second winding is connected to the second terminal of the third capacitor; and
a second acoustic wave resonator (AWR) having a first electrode coupled to the second node and a second electrode coupled to the second port.

14. A filter comprising:
a first port and a second port;
a first acoustic wave resonator (AWR) having a first electrode coupled to the first port and a second electrode coupled to ground;
a first inductor having a first terminal coupled to the first port and a second terminal coupled to a first node;
a first capacitor having a first electrode coupled to the first port and a second electrode coupled to the first node;
a second capacitor having a first electrode coupled to the first node;
a second inductor having a first terminal coupled to the first node and a second terminal coupled to ground;
a third inductor having a first terminal coupled to the first node and a second terminal coupled to a second node;
a fourth inductor having a first terminal coupled to the second node and a second terminal coupled to ground;
a third capacitor having a first electrode coupled to the second node;
a second acoustic wave resonator (AWR) having a first electrode coupled to the second node and a second electrode coupled to the second port;
a fifth inductor having a first terminal coupled to the first port and a second terminal coupled to ground, wherein the first terminal of the second AWR is coupled to the second node through a sixth inductor.

15. A filter comprising:
a first port and a second port;
a first acoustic wave resonator (AWR) having a first electrode coupled to the first port and a second electrode coupled to ground;
a first inductor having a first terminal coupled to the first port and a second terminal coupled to a first node;
a first capacitor having a first electrode coupled to the first port and a second electrode coupled to the first node;
a second capacitor having a first electrode coupled to the first node;
a second inductor having a first terminal coupled to the first node and a second terminal coupled to a first terminal of a third inductor, the third inductor having a second terminal coupled to ground;
a fourth inductor having a first terminal coupled to a second node, the fourth inductor having a second terminal coupled to the second terminal of the second inductor and to the first terminal of the third inductor;
a third capacitor having a first electrode coupled to the second node; and
a second acoustic wave resonator (AWR) having a first electrode coupled to the second node and a second electrode coupled to the second port.

16. The filter of claim 15 further comprising a fifth inductor having a first terminal coupled to the first port and a second terminal coupled to ground.

17. The filter of claim 16 wherein the first terminal of the second AWR is coupled to the second node through a sixth inductor.

18. A filter comprising:
a first port and a second port;
a first acoustic wave resonator (AWR) having a first electrode coupled to the first port and a second electrode coupled to ground;
a first inductor having a first terminal coupled to the first port and a second terminal coupled to a first node;
a first capacitor having a first electrode coupled to the first port and a second electrode coupled to the first node;
a second capacitor having a first electrode coupled to the first node;
a second inductor having a first terminal coupled to the first node and a second terminal coupled to ground;
a third inductor having a first terminal coupled to the first node and a second terminal coupled to a second node;

a fourth inductor having a first terminal coupled to the second node and a second terminal coupled to ground, wherein the first terminal of the third inductor is coupled to the first terminal of the second inductor, and wherein the second terminal of the third inductor is coupled to the first terminal of the fourth inductor;
a third capacitor having a first electrode coupled to the second node; and
a second acoustic wave resonator (AWR) having a first electrode coupled to the second node and a second electrode coupled to the second port.

19. The filter of claim 18 further comprising a fifth inductor having a first terminal coupled to the first port and a second terminal coupled to ground.

20. The filter of claim 19 wherein the first terminal of the second AWR is coupled to the second node through a sixth inductor.

21. A filter comprising:
a first port and a second port;
a first acoustic wave resonator (AWR) having a first electrode coupled to the first port and a second electrode coupled to ground;
a first inductor having a first terminal coupled to the first port and a second terminal coupled to a first node;
a first capacitor having a first electrode coupled to the first port and a second electrode coupled to the first node;
a second capacitor having a first electrode coupled to the first node, wherein a second electrode of the second capacitor is coupled to ground;
a transformer having a first winding having a first terminal coupled to the first node and a second terminal coupled to ground and having a second winding having a first terminal coupled to a second node and a second terminal coupled to ground;
a third capacitor having a first electrode coupled to the second node, wherein a second electrode of the third capacitor is coupled to ground; and
a second acoustic wave resonator (AWR) having a first electrode coupled to the second node and a second electrode coupled to the second port.

22. A filter comprising:
a first port and a second port;
a first acoustic wave resonator (AWR) having a first electrode coupled to the first port and a second electrode coupled to ground;
a first inductor having a first terminal coupled to the first port and a second terminal coupled to a first node;
a first capacitor having a first electrode coupled to the first port and a second electrode coupled to the first node;
a second capacitor having a first electrode coupled to the first node;
a transformer having a first winding having a first terminal coupled to the first node and a second terminal coupled to ground and having a second winding having a first terminal coupled to a second node and a second terminal coupled to ground;
a third capacitor having a first electrode coupled to the second node;
a second acoustic wave resonator (AWR) having a first electrode coupled to the second node and a second electrode coupled to the second port; and
a fourth capacitor having a first electrode coupled to the first node and a second electrode coupled to the second node.

23. A filter comprising:
a first port and a second port;
a first acoustic wave resonator (AWR) having a first electrode coupled to the first port and a second electrode coupled to ground;
a first inductor having a first terminal coupled to the first port and a second terminal coupled to a first node;
a first capacitor having a first electrode coupled to the first port and a second electrode coupled to the first node;
a second capacitor having a first electrode coupled to the first node;
a transformer having a first winding having a first terminal coupled to the first node and a second terminal coupled to ground and having a second winding having a first terminal coupled to a second node and a second terminal coupled to ground;
a third capacitor having a first electrode coupled to the second node;
a second acoustic wave resonator (AWR) having a first electrode coupled to the second node and a second electrode coupled to the second port, wherein the first AWR has a first resonance frequency and the second AWR has a second resonance frequency which is offset from the first resonance frequency; and
a third acoustic wave resonator (AWR) having a first terminal coupled to the first port and a second terminal coupled to ground.

24. A filter comprising:
a first port and a second port;
a first acoustic wave resonator (AWR) having a first electrode coupled to the first port and a second electrode coupled to ground;
a first inductor having a first terminal coupled to the first port and a second terminal coupled to a first node;
a first capacitor having a first electrode coupled to the first port and a second electrode coupled to the first node;
a second capacitor having a first electrode coupled to the first node;
a transformer having a first winding having a first terminal coupled to the first node and a second terminal coupled to ground and having a second winding having a first terminal coupled to a second node and a second terminal coupled to ground;
a third capacitor having a first electrode coupled to the second node;
a second acoustic wave resonator (AWR) having a first electrode coupled to the second node and a second electrode coupled to the second port;
a third acoustic wave resonator (AWR) having a first terminal coupled to the first port and a second terminal coupled to ground; and
a fourth acoustic wave resonator (AWR) having a first electrode coupled to the first port and a second electrode coupled to ground, wherein the first AWR has a first resonance frequency, the third AWR has a second resonance frequency and the fourth AWR has a third resonance frequency, wherein the second resonance frequency is offset from the first resonance frequency and the third resonance frequency is offset from the first resonance frequency and the second resonance frequency.

* * * * *